US012221569B2

(12) United States Patent
Choi et al.

(10) Patent No.: US 12,221,569 B2
(45) Date of Patent: Feb. 11, 2025

(54) ADHESIVE TAPE FOR SEMICONDUCTOR PACKAGE MANUFACTURING PROCESS, AND METHOD FOR MANUFACTURING SAME

(71) Applicant: MODU TECH CO., LTD., Gyeonggi-do (KR)

(72) Inventors: Byeong Yeon Choi, Gyeonggi-do (KR); Seung Yol Lee, Gyeonggi-do (KR); Suk Hee Kang, Gyeonggi-do (KR); Gyung Ju Yoon, Gyeonggi-do (KR)

(73) Assignee: MODU TECH CO., LTD., Gyeonggi-do (KR)

( * ) Notice: Subject to any disclaimer, the term of this patent is extended or adjusted under 35 U.S.C. 154(b) by 555 days.

(21) Appl. No.: 17/440,049

(22) PCT Filed: Oct. 30, 2019

(86) PCT No.: PCT/KR2019/014463
§ 371 (c)(1),
(2) Date: Nov. 4, 2021

(87) PCT Pub. No.: WO2020/189873
PCT Pub. Date: Sep. 24, 2020

(65) Prior Publication Data
US 2022/0220345 A1    Jul. 14, 2022

(30) Foreign Application Priority Data

Mar. 18, 2019  (KR) .................. 10-2019-0030488
Jun. 13, 2019  (KR) .................. 10-2019-0070137
Sep. 27, 2019  (KR) .................. 10-2019-0119666

(51) Int. Cl.
*C09J 7/29*    (2018.01)
*C09J 7/30*    (2018.01)
(Continued)

(52) U.S. Cl.
CPC .  *C09J 7/29* (2018.01); *C09J 7/30* (2018.01); *C09J 7/40* (2018.01); *C09J 7/50* (2018.01);
(Continued)

(58) Field of Classification Search
None
See application file for complete search history.

(56) References Cited

U.S. PATENT DOCUMENTS

| 2013/0224416 A1 | 8/2013 | Cho et al. |
| 2014/0017491 A1 | 1/2014 | Wouters et al. |
| 2020/0123419 A1* | 4/2020 | Baetzold ................... C09J 9/00 |

FOREIGN PATENT DOCUMENTS

| JP | 2019-038907 A | 3/2019 |
| KR | 10-2012-0050136 A | 5/2012 |

(Continued)

OTHER PUBLICATIONS

KR20190008150 English Machine Translation.*

*Primary Examiner* — Scott R. Walshon
(74) *Attorney, Agent, or Firm* — IP Legal Services, LLC

(57) ABSTRACT

Provided is an adhesive tape for a semiconductor package manufacturing process. The adhesive type includes: a first adhesive layer formed on a first base film; a second base film formed on the first adhesive layer, in which the second base film changes its shape to conform to the topology of the semiconductor package bottom surface when the adhesive tape is attached to the semiconductor package bottom surface, and containing a metal element so as to independently maintain the changed shape during the process; and a second adhesive layer formed on the second base film, the second adhesive layer having a smaller thickness than the first adhesive layer and having a lower adhesive strength than the first adhesive layer, wherein each of the first adhesive layer and the second adhesive layer has a spiral network molecu- (Continued)

lar structure and includes a first adhesive composition containing silicone.

15 Claims, 5 Drawing Sheets

(51) Int. Cl.
*C09J 7/40* (2018.01)
*C09J 7/50* (2018.01)
*C09J 183/06* (2006.01)
*H01L 23/482* (2006.01)

(52) U.S. Cl.
CPC ........ *C09J 183/06* (2013.01); *H01L 23/4827* (2013.01); *C09J 2203/326* (2013.01); *C09J 2301/124* (2020.08); *C09J 2483/00* (2013.01)

(56) References Cited

FOREIGN PATENT DOCUMENTS

| | | | |
|---|---|---|---|
| KR | 10-2013-0080346 A | 7/2013 |
| KR | 10-2014-0013039 A | 2/2014 |
| KR | 10-1662068 B1 | 10/2016 |
| KR | 10-2018-0112536 A | 10/2018 |
| KR | 10-2018-0118628 A | 10/2018 |
| KR | 10-2019-0008150 A | 1/2019 |
| KR | 10-2019-0024386 A | 3/2019 |
| WO | 2018/101090 A1 | 6/2018 |

\* cited by examiner

ADHESIVE TAPE FOR SEMICONDUCTOR PACKAGE MANUFACTURING PROCESS, AND METHOD FOR MANUFACTURING SAME

CROSS REFERENCE TO RELATED APPLICATIONS

This application is a National Stage Patent Application of PCT International Patent Application No. PCT/KR2019/014463 (filed on Oct. 30, 2019) under 35 U.S.C. § 371, which claims priority to Korean Patent Application Nos. 10-2019-0030488 (filed on Mar. 18, 2019), 10-2019-0070137 (filed on Jun. 13, 2019), and 10-2019-0119666 (filed on Sep. 27, 2019), the teachings of which are incorporated herein in their entireties by reference.

TECHNICAL FIELD

The present disclosure relates to an adhesive tape for a semiconductor package manufacturing process, and more particularly, to an adhesive tape for a semiconductor package manufacturing process, which is capable of protecting the bottom surface of a semiconductor package and a plurality of protruding extrudes formed on the bottom surface of the semiconductor package during the process of forming an electromagnetic interference (EMI) shielding layer on the semiconductor package, and a method for producing the same.

BACKGROUND ART

As a type of semiconductor package, a ball grid array (BGA) is widely used. The BGA achieves the contact of the semiconductor package with an external terminal by means of solder balls, and allows transmission of a larger amount of signals by replacement with a plurality of protruding electrodes (i.e., solder balls) exposed at the bottom, instead of transmitting signals to one side, both sides, and four sides in a lead frame type package. This BGA package is produced as a main package for next-generation high-speed memory, and expands the field of use of a chip scale package (CSP), which was limited to portable information and communication devices such as mobile phones or digital cameras, to the field of computers such as PCs or workstations.

On the other hand, in the mobile field, in order to increase the battery life, two requirements should be achieved: an increase in the size of the battery, and a decrease in the size of the terminal. In order to achieve the two requirements at the same time, there is a need to relatively reduce the size of the PCB occupied in the terminal. However, as the size of the PCB is reduced, the gap between the semiconductor elements included in the PCB is narrowed, and thus an error may inevitably occur due to electromagnetic interference between the semiconductor elements. In order to suppress the electromagnetic interference between the semiconductor elements, a method of covering the semiconductor element with a shielding cap or a technology of forming a shielding metal coating on the outer surface of the semiconductor element by an EMI sputtering technique has been developed and introduced.

Among them, the technology of forming a shielding metal coating by sputtering refers to forming a metal thin film for electromagnetic wave shielding on the entire outer surface except for the connection terminal of the semiconductor element by a sputtering process. In the case of a BGA semiconductor package, as a method that does not affect the connection terminal during the sputtering process for electromagnetic wave shielding, a method of accommodating a semiconductor package in a perforated tape having a size equal to that of the semiconductor package so as to expose only the top surface of the package and applying sputtering to the exposed surface has been proposed (see Korean Patent No. 10-1662068). However, this method has problems in that excessive costs are incurred in perforating the tape to form holes, and if the semiconductor package is not accurately placed in the tape having the holes, the thin film deposited by sputtering is defective.

DISCLOSURE

Technical Problem

An object of the present disclosure is to provide an adhesive tape for a semiconductor package manufacturing process, which is capable of protecting the bottom surface of a semiconductor package and a plurality of protruding electrodes formed on the bottom surface of the semiconductor package during the process of manufacturing the semiconductor package having the plurality of protruding electrodes, and a method for producing the same.

Another object of the present disclosure is to provide an adhesive tape for a semiconductor package manufacturing process, which may be easily separated from a semiconductor package without leaving residue after completion of a specific manufacturing process, and a method for producing the same.

Objects of the present disclosure are not limited to those mentioned above, and other objects not mentioned herein will be clearly understood by those skilled in the art from the following description.

Technical Solution

According to one aspect of the present disclosure for achieving the objects of the present disclosure, there is provided an adhesive tape for a semiconductor package manufacturing process, which is configured to be attached to the semiconductor package bottom surface having a plurality of protruding electrodes formed thereon, the adhesive tape including: a first adhesive layer formed on a first base film; a second base film formed on the first adhesive layer, in which the second base film changes its shape to conform to the topology of the semiconductor package bottom surface when the adhesive tape is attached to the semiconductor package bottom surface, and the second base film contains a metal element so as to independently maintain the changed shape during the process; and a second adhesive layer formed on the second base film, the second adhesive layer having a smaller thickness than the first adhesive layer and having a lower adhesive strength than the first adhesive layer, wherein each of the first adhesive layer and the second adhesive layer has a spiral network molecular structure and includes a first adhesive composition containing silicone.

In the present disclosure, the adhesive tape may further include a fluorine-containing release film attached to the second adhesive layer, and the release film may have an adhesive strength ranging from 3 gf/25 mm to 8 gf/25 mm.

In the present disclosure, the adhesive tape may further include: a first intermediate layer interposed between the first base film and the first adhesive layer; and a second intermediate layer interposed between the second base film and the second adhesive layer, wherein each of the first intermediate layer and the second intermediate layer has a spiral network molecular structure, includes a second adhesive composition containing silicone, and has a basis weight ranging from 0.2 g/m² to 0.5 g/m². The second adhesive composition may include a mixture of: toluene; siloxanes and silicones, di-Me, hydroxy-terminated (CAS No. 70131-67-8); xylene; trimethylated silica; and ethylbenzene.

In the present disclosure, the first base film may have either a single layer structure composed of any one layer selected from the group consisting of a polyethylene terephthalate (PET) layer, a polyimide (PI) layer and a polyolefin (PO) layer, or a multilayer structure composed of two or more of these layers, and may have a thickness ranging from 10 μm to 150 μm. A surface of the first base film, which is in contact with the first adhesive layer, may be a surface treated using a corona discharge treatment method or an ion-assisted reaction method.

In the present disclosure, the first base film may change its shape to conform to the topology of the semiconductor package bottom surface when the adhesive film is attached to the semiconductor package bottom surface, and may contain a metal element so as to independently maintain the changed shape during the process. Each of the first base film and the second base film may contain at least 99 wt % of aluminum (Al), and each of the first base film and the second base film, which contain the aluminum, may have a tensile strength ranging from 6 kgf/mm² to 12 kgf/mm², an elongation ranging from 8% to 16%, and a thickness ranging from 10 μm to 35 μm. In addition, each of the first base film and the second base film may contain at least 99 wt % of copper (Cu), and each of the first base film and the second base film, which contain the copper, may have a tensile strength ranging from 10 kgf/mm² to 26 kgf/mm², an elongation ranging from 4% to 12%, and a thickness ranging from 10 μm to 35 μm.

In the present disclosure, the second base film may have a thickness ranging from 10 μm to 35 μm, and as the size of each of the protruding electrodes increases, the thickness of the second base film may decrease within the thickness range, and as the spacing between the protruding electrodes increases, the thickness of the second base film may increase within the above-specified thickness range.

In the present disclosure, the adhesive layer may include a plurality of perforated holes, which are regularly arranged in the second base film and pass through the second base film, in which each of the plurality of perforated holes may have any one planar shape selected from the group consisting of a triangular or higher polygonal shape, an oval shape and a circular shape, and the first adhesive layer and the second adhesive layer may be in direct contact with each other through the plurality of perforated holes.

In the present disclosure, the first adhesive layer may have a thickness ranging from 100 μm to 700 μm and an adhesive strength of at least 500 gf/25 mm, and the second adhesive layer may have a thickness ranging from 10 μm to 50 μm and an adhesive strength ranging from 200 gf/25 mm to 300 gf/25 mm.

In the present disclosure, the first adhesive layer may have a thickness ranging from 100 μm to 700 μm, and as the size of each of the protruding electrodes increases, the thickness of the first adhesive layer may decrease within the above thickness range, and as the spacing between the protruding electrodes increases, the thickness of the first adhesive layer may increase within the thickness range, and the second adhesive layer may have a thickness ranging from 10 μm to 50 μm, and as the size of each of the protruding electrodes increases, the thickness of the second adhesive layer may increase within the thickness range, and as the spacing between the protruding electrodes increases, the thickness of the second adhesive layer may decrease within the thickness range.

In the present disclosure, the first adhesive composition may contain an adhesive base agent including a mixture of trimethylated silica, a dimethyl siloxane copolymer, and ethylbenzene.

Specifically, the first adhesive composition may further contain, based on 100 parts by weight of the adhesive base agent, 0.5 to 1.5 parts by weight of a crosslinker agent, 0.5 to 1.5 parts by weight of an anchorage additive, and 0.5 to 1.8 parts by weight of a catalyst, and the adhesive base agent may include a mixture of: xylene; trimethylated silica; ethylbenzene; and siloxanes and silicones, di-Me, vinyl group-terminated (CAS No. 68083-19-2).

In addition, the first adhesive composition may further contain, based on 100 parts by weight of the adhesive base agent composed of a first base agent and a second base agent, mixed with each other at a ratio of 95:5 to 99:1, 0.5 to 1.5 parts by weight of a crosslinker agent, 0.5 to 1.5 parts by weight of an anchorage additive, and 0.5 to 1.5 parts by weight of a catalyst, in which the first base agent may include a mixture of: xylene; trimethylated silica; ethylbenzene; and siloxanes and silicones, di-Me, vinyl group-terminated (CAS No. 68083-19-2), and the second base agent may include a mixture of: siloxanes and silicones, di-Me, vinyl group-terminated (CAS No. 68083-19-2); and 1-ethynylcyclohexanol (CAS No. 78-27-3).

The crosslinker agent may include a mixture of: heptane; and siloxanes and silicones, Me hydrogen (CAS No. 63148-57-2), the anchorage additive may include a mixture of: trimethoxy[3-(oxiranylmethoxy)propyl]silane (CAS No. 2530-83-8; siloxanes and silicones, di-Me, Me vinyl, hydroxy-terminated reaction products with trimethoxy[3-oxiranylmethoxy)propyl]silane (CAS No. 102782-94-5); methanol; and divinyl hexamethyl cyclotetrasiloxane (CAS No. 17980-61-9), and the catalyst may include a mixture of: platinum 1,3-diethenyl-1,1,3,3-tetramethyldisiloxane complexes (CAS No. 68478-92-2); siloxanes and silicones, di-Me, vinyl group-terminated (CAS No. 68083-19-2); tetramethyldivinyldisiloxane (CAS No. 2627-95-4); and siloxanes and silicones, di-Me, hydroxy-terminated (CAS No. 70131-67-8).

In addition, the first adhesive composition may further contain, based on 100 parts by weight of the adhesive base agent composed of a third base agent and a fourth base agent, mixed with each other at a ratio of 50:50 to 80:20, 0.5 to 3 parts by weight of a polymerization initiator, in which the third base agent may include a mixture of: xylene; ethylbenzene; toluene; and siloxanes and silicones, di-Me, hydroxy-terminated reaction products with chlorotrimethylsilane, hydrochloric acid, iso-Pr alc. and sodium silicate (CAS No. 68440-70-0), the fourth base agent may include a mixture of: toluene; siloxanes and silicones, di-Me, hydroxy-terminated (CAS No. 70131-67-8); xylene; trimethylated silica; and ethylbenzene, and the polymerization initiator may include benzoyl peroxide.

In addition, the first adhesive composition may further contain, based on 100 parts by weight of the adhesive base agent composed of a third base agent and a fifth base agent, mixed with each other at a ratio of 50:50 to 80:20, 0.5 to 3 parts by weight of a polymerization initiator, in which the third base agent may include a mixture of: xylene; ethylbenzene; toluene; and siloxanes and silicones, di-Me, hydroxy-terminated reaction products with chlorotrimethylsilane, hydrochloric acid, iso-Pr alc. and sodium silicate (CAS No. 68440-70-0), the fifth base agent may include a mixture of: toluene; siloxanes and silicones, di-Me, Me vinyl, vinyl group terminated (CAS No. 68083-18-1); xylene; trimethylated silica; ethylbenzene; siloxanes and silicones, di-Me, Me vinyl, hydroxy-terminated (CAS No. 67923-19-7); and 1-ethynylcyclohexanol (CAS No. 78-27-3), and the polymerization initiator may include benzoyl peroxide.

According to another aspect of the present disclosure for achieving the objects of the present disclosure, there is provided a method for producing an adhesive tape, the method including steps of: producing a first tape in which a first base film including a polymer material or a metal material, a first adhesive layer having a spiral network molecular structure and containing silicone, and a first release film containing fluorine, are sequentially laminated; producing a second tape in which a second base film including a metal material, a second adhesive layer having a spiral network molecular structure and containing silicone, and a second release film containing fluorine, are sequentially laminated; removing the first release film from the first tape; and laminating the first tape and the second tape together so that the first adhesive layer and the second base film are in contact with each other.

Advantageous Effects

The adhesive tape for a semiconductor package manufacturing process and a production method therefor according to the present disclosure provide the following effects.

First, the adhesive tape for the semiconductor package manufacturing process according to the present disclosure has the effect of improving productivity and price competitiveness, because it has a very simple structure in which the first base film, the first adhesive layer, the second base film and the second adhesive layer are sequentially laminated.

In addition, since the first base film includes either a single layer structure composed of any one layer selected from the group consisting of a polyethylene terephthalate (PET) layer, a polyimide (PI) layer and a polyolefin (PO) layer, or a multilayer structure composed of two or more of these layers, it has the effect of easily securing the stress characteristics required for the adhesive tape for the semiconductor package manufacturing process, which is used in a process of forming an EMI shielding layer.

In addition, when the first base film is composed of a polymer material, even if a silicone material is used for the first adhesive layer, the adhesive strength between the first base film and the first adhesive layer may be enhanced by performing surface treatment on a surface of the first base film, which is in contact with the first adhesive layer.

In addition, since the first base film has a thickness ranging from 10 µm to 150 µm, the stress balance is effectively maintained so that the first base film conforms to the topology of the semiconductor package bottom surface having a plurality of protruding electrodes formed thereon, and at the same time, the adhesive tape is easily handled.

In addition, since the second base film changes its shape to conform to the topology of the semiconductor package bottom surface and contains a metal element so as to independently maintain the changed shape during the process, it is possible to easily secure the adhesive properties and retention properties required for the adhesive tape for a semiconductor package manufacturing process, which is used in a process of forming an EMI shielding layer. In addition, when the first base film contains a metal element in the same way as the second base film, it is possible to more easily secure the above-described adhesive properties and retention properties.

In addition, since the second base film containing a metal element has a very small thickness ranging from 10 µm to 35 µm, the stress balance may be effectively maintained so that the second base film conforms to the topology of the semiconductor package bottom surface having a plurality of protruding electrodes formed thereon.

In addition, as molecular structure continuity between the first adhesive layer and the second adhesive layer is provided through a plurality of perforated holes formed in the second base film, even if an air gap occurs between the semiconductor package and the adhesive tape in a region where the semiconductor package bottom surface and the protruding electrode contact each other, it is possible to prevent the air gap from excessively expanding during the manufacturing process (in particular, during a process in a high vacuum environment).

In addition, since each of the first and second adhesive layers includes an adhesive base agent including a mixture of trimethylated silica, a dimethylsiloxane copolymer and ethylbenzene, there is no change in physical properties due to heat generated during the process of forming an EMI shielding layer, and it is possible to easily secure the adhesive properties, retention properties, removal properties and stress properties required for the adhesive tape for the semiconductor package manufacturing process.

In addition, since each of the first adhesive layer and the second adhesive layer has a spiral network structure based on a siloxane bond as a main skeleton, even if an air gap occurs between the semiconductor package and the adhesive tape in a region where the semiconductor package bottom surface and the protruding electrode contact each other, it is possible to prevent the air gap from excessively expanding during the manufacturing process (in particular, during a process in a high vacuum environment).

In addition, since the second adhesive layer has a very small thickness ranging from 10 µm to 50 µm, it may be easily attached and adhered closely to the semiconductor package bottom surface following the topology of the semiconductor package bottom surface having a plurality of protruding electrodes formed thereon, and it is possible to prevent the second adhesive layer from being rolled up to the edge side of the semiconductor package when the adhesive tape is attached.

In addition, since the thickness of each of the first adhesive layer and the second adhesive layer and the thickness of each of the first base film and the second base film are optimized depending on the size of and spacing between the protruding electrodes of the semiconductor package, it is possible to more effectively secure the adhesive properties, retention properties, removal properties and stress properties required for the adhesive tape for a semiconductor package manufacturing process, which is used in a process of forming an EMI shielding layer.

In addition, since it is possible to reduce the number of process steps and the consumption of consumables compared to a conventional process of forming an EMI shielding layer on a semiconductor package, it is possible to improve semiconductor package productivity.

In addition, as the adhesive tape is produced by laminating the first tape and the second tape together at the site where the semiconductor package manufacturing process is performed, after the first tape and the second tape are produced individually, transportation and storage thereof are easy, and it is possible to enhance the quality of the adhesive tape and improve the yield of the semiconductor package manufacturing process.

Effects of the present disclosure are not limited to those mentioned above, and other effects not mentioned herein will be clearly understood by those skilled in the art from the following description.

BEST MODE

Figure 1:
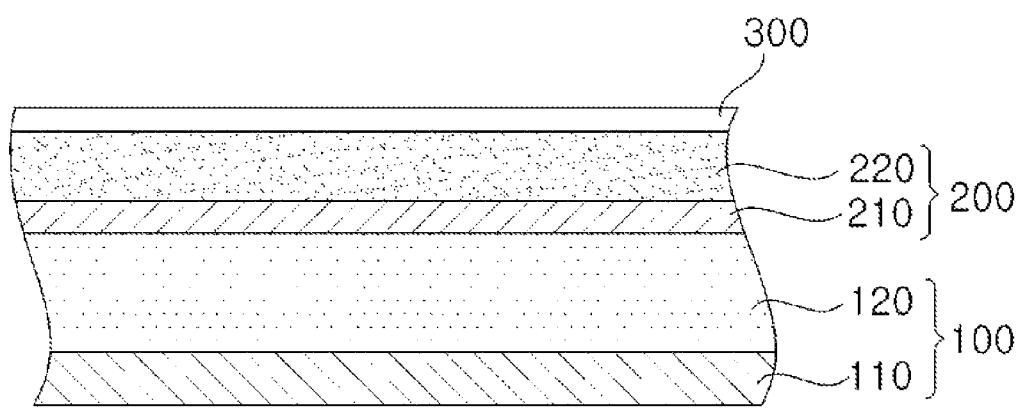
FIG. 1 is a view schematically showing a section of an adhesive tape for a semiconductor package manufacturing process according to a first embodiment of the present disclosure.

The present disclosure may be subjected to various modifications and may have various embodiments, and specific embodiments are illustrated in the drawings and will be described in detail in the detailed description. However, this is not intended to limit the present disclosure to specific embodiments. It should be understood that the present disclosure includes all modifications, equivalents or replacements that fall within the spirit and technical range of the present disclosure. In the following description, the detailed description of related publicly-known technology will be omitted when it may unnecessarily obscure the subject matter of the present disclosure.

The terms used in the present application are only used to describe specific embodiments, and are not intended to limit the present disclosure. Singular expressions include plural expressions unless the context clearly indicates otherwise. In the present specification, it should be understood that terms such as "include" and "have" are intended to denote the existence of stated characteristics, numbers, steps, operations, components, parts, or combinations thereof, but do not exclude the probability of existence or addition of one or more other characteristics, numbers, steps, operations, components, parts, or combinations thereof.

Although terms such as "first" and "second" may be used to describe various components, the components should not be limited by these terms. These terms are used only to distinguish one component from another component.

Hereinafter, embodiments according to the present disclosure will be described in detail with reference to the accompanying drawings. In the following description referring to the accompanying drawings, the same or corresponding components are denoted by the same reference numerals, and the repeated description thereof will be omitted. In addition, as the name of the substances according to CAS No. in the present specification, the name provided by the comprehensive chemical information system (URL: https://icis.me.go.kr/) will be used.

Embodiments of the present disclosure to be described later are intended to provide an adhesive tape for a semiconductor package manufacturing process, and more particularly, are intended to provide an adhesive tape for a semiconductor package manufacturing process, which is capable of protecting the bottom surface of a semiconductor package and a plurality of protruding electrodes formed on the bottom surfaces of the semiconductor package in a process of forming an electromagnetic interference (EMI) shielding layer on a semiconductor package having a plurality of protruding electrodes, such as BGA (ball grid array) or LGA (land grid array), and a method for producing the same.

Prior to describing the adhesive tape for a semiconductor package manufacturing process according to an embodiment of the present disclosure, the adhesive tape for a semiconductor package manufacturing process, which is commonly used in a process of forming an EMI shielding layer, needs to ensure an adhesive characteristic, retention characteristics, removal characteristics and stress characteristics.

First, in terms of adhesive properties, the base film and adhesive layer of the adhesive tape are capable of being attached and adhered closely to a semiconductor package to conform to the protruding electrodes and the topology of the semiconductor package bottom surface including protruding electrodes, regardless of the size (e.g., diameter or height) of the protruding electrode, so that an air gap does not occur in a region where the semiconductor package bottom surface and the protruding electrode contact each other. In addition, the adhesive tape must adhere well without pushing the protruding electrodes in a process environment for forming an EMI shielding layer, for example, a high-temperature and high-vacuum environment. That is, the adhesive tape should be able to continuously maintain its attachment ability and adhesion ability even in a process environment for forming an EMI shielding layer.

Next, in terms of retention characteristics, the adhesive tape should be able to maintain its original shape without self-denaturation, deformation, discoloration, and outgassing under the process conditions for forming the EMI shielding layer, and at the same time, should be able to maintain its adhesive ability and sealing ability so as to prevent gases and particles from penetrating between the adhesive tape and the adhering surface of the semiconductor package during the process. In addition, when an air gap occurs in a region where the semiconductor package bottom surface and the protruding electrode contact each other, it should be possible to prevent the air gap from excessively expanding during the process (particularly, during a process in a high vacuum environment).

Next, in terms of removal characteristics, when the adhesive tape is removed from the semiconductor package at room temperature and atmospheric pressure after completion of the process of forming an EMI shielding layer, the adhesive tape should be able to be easily removed even with a small force without leaving the adhesive material on the semiconductor package bottom surface and the surface of the protruding electrode. In particular, the adhesive tape should have an adhesive strength such that the semiconductor package can be easily separated by an automated facility that automatically separates a semiconductor package (or chip) from the adhesive tape, and it should not be punctured or torn by a vacuum chuck or lift pin used in the automated facility. Since the maximum tensile tension of the automated facility that automatically separates a semiconductor package (or semiconductor chip) from an adhesive tape is generally about 500 gf/25 mm, it is preferable in terms of removal characteristics that the adhesive tape has a lower adhesive strength than the maximum tensile tension.

In addition, in terms of stress characteristics, since a plurality of semiconductor packages, that is, a plurality of semiconductor chips, are placed on and adhered to the adhesive tape during the process of forming an EMI shielding layer, the adhesive tape need to have appropriate levels of tensile stress and compressive stress so that the process of forming an EMI shielding layer may be performed while a constant spacing between adjacent semiconductor chips is maintained. That is, the adhesive tape should be able to be stably maintained in a taut state, and at the same time, to maintain stress balance depending on the topology of the semiconductor package bottom surface including the protruding electrodes.

Therefore, embodiments of the present disclosure to be described later provides an adhesive tape for a semiconductor package manufacturing process, which may satisfy the adhesive characteristics, retention characteristics, removal characteristics and stress characteristics required during the semiconductor package manufacturing process, particularly, a process of forming an EMI shielding layer. To this end, the adhesive tape for a semiconductor package according to an embodiment of the present disclosure may have a simple structure in which a base film and an adhesive layer are laminated together, in order to secure productivity and price competitiveness. The adhesive layer has no outgassing while maintaining its chemical resistance, heat resistance and cold resistance, and has a thickness that allows the adhesive layer to be attached and adhered closely to the semiconductor package bottom surface following the topology of the semiconductor package bottom surface having a plurality of protruding electrodes formed thereon. In addition, the adhesive layer is soft to impregnate the protruding electrodes, is not modified, and may be composed of a silicone material so that it may be detached without leaving residue. In addition, the base film may be composed of a metal material so that it may be stably maintained in a taut state without stretching during the semiconductor package manufacturing process, and at the same time, may change its shape depending on the topology of the adherend surface, may independently maintain the changed shape during the process, and is not modified and deformed in a high-temperature and high-vacuum environment.

Hereinafter, an adhesive tape for a semiconductor package according to embodiments of the present disclosure will be described in detail with reference to the drawings.

Figure 2:
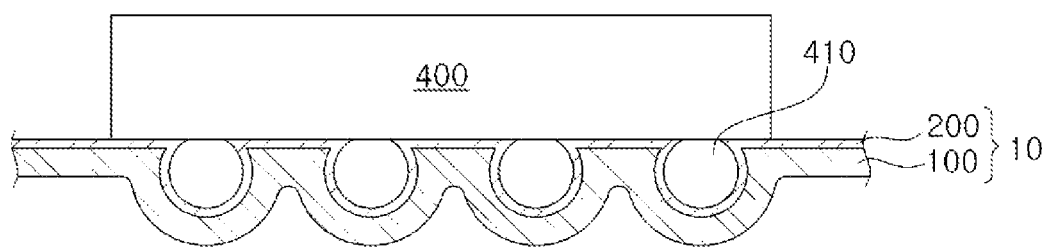
FIG. 2 is a view showing a sectional shape of a structure in which the adhesive tape for a semiconductor package manufacturing process according to a first embodiment of the present disclosure is adhered to the bottom surface of a semiconductor package.
Figure 3A:
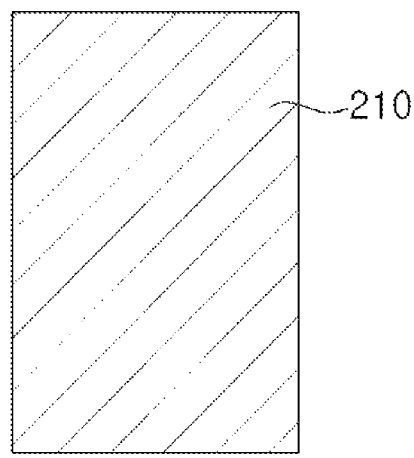
FIGS. 3a and 3b are views showing the planar shapes of second base films applicable to adhesive tapes for a semiconductor package manufacturing process according to the first and second embodiments of the present disclosure.
Figure 3B:
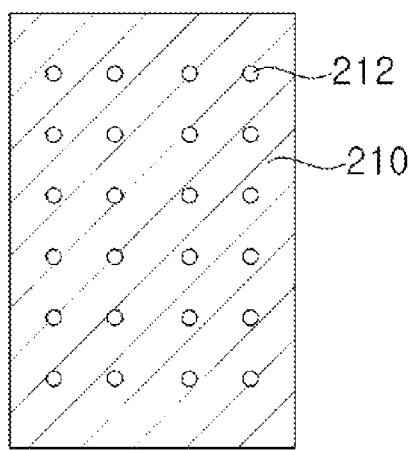

FIG. 1 is a view schematically showing a section of an adhesive tape for a semiconductor package manufacturing process according to a first embodiment of the present disclosure; FIG. 2 is a view showing a sectional shape of a structure in which the adhesive tape for a semiconductor package manufacturing process according to a first embodiment of the present disclosure is adhered to the bottom surface of a semiconductor package; and FIGS. 3a and 3b are views showing the planar shapes of second base films applicable to adhesive tapes for a semiconductor package manufacturing process according to the first and second embodiments of the present disclosure.

As shown in FIGS. 1 and 2, an adhesive tape 10 for a process for manufacturing a semiconductor package 400 according to a first embodiment of the present disclosure may have a configuration in which a first tape 100 and a second tape 200 are laminated together. The first tape 100 and the second tape 200 may be separately fabricated to facilitate transportation and storage thereof, and the first tape 100 and the second tape 200 may be laminated together at the site during the process of manufacturing the semiconductor package 400, whereby the adhesive tape 10 may be produced and used. The second tape 200 may be in contact with the bottom surface of the semiconductor package 400, which has a plurality of protruding electrodes 410 formed thereon, and the plurality of protruding electrodes 410 formed on the bottom surface of the semiconductor package 400 may be configured to be surrounded by the second tape 200 while being configured to be impregnated by the first tape 100. For reference, although not shown in the drawings, an EMI shielding layer may be formed on the entire surface of the semiconductor package 400 excluding the bottom surface, that is, on the top surface and side surface of the semiconductor package 400.

The first tape 100 in the adhesive tape 10 according to the first embodiment may serve to prevent the second tape 200 from being damaged during the process. In addition, the first tape 100 may also serve to prevent a process failure from occurring, even if the second tape 200 is partially damaged during the process. For reference, in the process of pressing the semiconductor package 400 against the adhesive tape 10 in order to attach and adhere the adhesive tape 10 to the bottom surface of the semiconductor package 400, which has the plurality of protruding electrode 410 formed thereon, a phenomenon may occur in which the adhesive tape 10 is torn by the edges of the protruding electrodes 410 and/or the semiconductor package 400. However, since the adhesive tape 10 according to the first embodiment has a configuration in which the first tape 100 and the second tape 200 are laminated together, it is possible to prevent the adhesive tape 10 from being damaged during the pressing process. In addition, even if the second tape 200 having a relatively small thickness compared to the first tape 100 is torn during the pressing process, the first tape 100 may compensate for this tearing, thus preventing a process failure from occurring.

Specifically, in the adhesive tape 10 according to the first embodiment, the first tape 100 may have a configuration in which a first base film 110 including a polymer material or a metal material and a first adhesive layer 120 containing silicone are sequentially laminated, and the second tape 200 may have a configuration in which a second base film 210 including a metal material and a second adhesive layer 220 containing silicone are sequentially laminated. Here, one surface and the other surface of the second base film 210 may be in contact with the first adhesive layer 120 and the second adhesive layer 220, respectively, and may be interposed therebetween.

In the first embodiment, the first base film 110 may include a material different from that of the second base film 210, or may include the same material as that of the second base film 210. In the former case, the first base film 110 may include a polymer material, and the second base film 210 may include a metal material. In the latter case, the first base film 110 and the second base film 210 may include a metal material.

First, when the first base film 110 includes a material different from that of the second base film 210, the first base film 110 may include a polymer material. Specifically, the first base film 110 may include a polymer material which is stably maintained in a taut state without stretching during the process of manufacturing the semiconductor package 400, and at the same time, may maintain stress balance so that the first base film conforms to the topology of the bottom surface of the semiconductor package 400 bottom surface having the plurality of protruding electrodes 410 formed thereon, and does not undergo modification and deformation in a high-temperature and high-vacuum environment. Accordingly, the first base film 110 may have either a single-layer structure composed of any one selected from the group consisting of a polyethylene terephthalate (PET) layer, a polyimide (PI) layer, and a polyolefin (PO) layer, or a multilayer structure composed of two or more of these layers.

The first base film 110 including a polymer material may have a thickness ranging from 10 μm to 150 μm. Here, if the thickness of the first base film 110 is smaller than 10 μm, it may be very difficult for a user to handle the adhesive tape 10, and if the thickness of the first base film 110 is larger than 150 μm, it may be difficult to maintain stress balance so as to conform to the topology of the semiconductor package 400 bottom surface having the plurality of protruding electrode 410 formed thereon. For reference, if the stress balance cannot be maintained, the repulsive force between the semiconductor package 400 and the adhesive tape 10 increases, and hence the attachment and close adhesion between the semiconductor package 400 and the adhesive tape 10 may decrease.

One surface of the first base film 110, which is in contact with the first adhesive layer 120 in the first base film 110 including a polymer material may be surface-treated to improve the adhesion between them. Since the silicone material used as the first adhesive layer 120 is not easy to mix and stir with and adhere to a different material, due to its unique chemical stability, it has low adhesion to the surface of the first base film 110 which has not been surface-treated, and thus a lifting phenomenon may occur, or a defect in the form in which the adhesive material is transferred to the adherend surface may occur. The surface treatment is intended to fundamentally prevent the above-described defects from occurring, and may be performed using corona discharge treatment or ion-assisted reaction. Fine irregularities may be formed on one surface of the surface-treated first base film 110, and the surface area and roughness of the one surface of the first base film 110 may be increased due to the fine irregularities. In addition, a dipole may be formed inside the surface-treated first base film 110, and one surface of the first base film 110, which is in contact with the first adhesive layer 120, may be charged by the dipole. In addition, a free radical having an unpaired electron may be attached to the one surface of the surface-treated first base film 110. As such, the one surface of the surface-treated first base film 110 may have an increased surface area and roughness, and may have a charged surface due to the dipole formed inside the first base film 110. In addition, as the free radical having an unpaired electron is attached to the surface, even when the first adhesive layer 120 is formed using a silicone material, the adhesion between the first base film 110 and the first adhesive layer 120 may be effectively improved. That is, through the surface treatment, it is possible to prevent the first adhesive layer 120 containing silicone from being peeled off from the first base film 110.

Meanwhile, when the first base film 110 and the second base film 210 include the same material, each of the first base film 110 and the second base film 210 may include a metal material. Hereinafter, for convenience of explanation, the second base film 210 will be explained as an example, and the base film including a metal material will be described in detail.

Like the first base film 110, the second base film 210 in the second tape 200 may be composed of a material which may be stably maintained in a taut state without stretching during the process of manufacturing the semiconductor package 400, and at the same time, may maintain stress balance so as to conform to the topology of the semiconductor package 400 bottom surface having the plurality of protruding electrodes 410 formed thereon, and does not undergo modification and deformation in a high-temperature and high-vacuum environment. In particular, the second base film 210 may change its shape so as to conform to the topology of the bottom surface of the semiconductor package 400 when the adhesive film is attached, and may independently maintain the shape, which has changed to conform to the topology of the bottom surface of the semiconductor package 400, during the process. To this end, the second base film 210 may include 99 wt % or more of a metal element.

For example, the second base film 210 may include 99 wt % or more of aluminum (Al). In addition, the second base film 210 may include, in addition to 99 wt % or more of aluminum, 1 wt % or less of an additive in order to control the properties of the second base film 210, for example, tensile strength and elongation. The additive may include any one or two or more selected from the group consisting of silicon (Si), iron (Fe), manganese (Mn), magnesium (Mg), zinc (Zn), and titanium (Ti). More specifically, the second base film 210 may include 99.35 wt % or more of aluminum, 0.15 wt % or less of silicon, 0.42 wt % or less of iron, 0.05 wt % or less of copper, 0.05 wt % or less of manganese, 0.05 wt % or less of magnesium, 0.1 wt % or less of zinc, and 0.06 wt % or less of titanium. Here, 99.35 wt % or more of aluminum may refer to a weight percentage of more than or equal to 99.35 wt % and less than 100 wt %, and 0.15 wt % or less of silicon may refer to a weight percentage of less than or equal to 0.15 wt % and more than 0 wt %. In addition, the weight percentage ranges of iron, copper, manganese, magnesium, zinc, and titanium may be interpreted in the same manner as in the above-described silicon.

The second base film 210 containing 99 wt % or more of aluminum may have a tensile strength of at least 6 kgf/mm$^2$ and an elongation of at least 8% so that it may be stably maintained in a taut state without stretching during the process of manufacturing the semiconductor package 400, and at the same time, may change its shape so as to conform to the topology of the bottom surface of the semiconductor package 400, and may independently maintain the changed shape during the process. More specifically, the second base film 210 containing 99 wt % or more of aluminum may have a tensile strength ranging from 6 kgf/mm$^2$ to 12 kgf/mm$^2$ and an elongation ranging from 8% to 16%. Here, if the tensile strength is lower than 6 kgf/mm$^2$, a phenomenon may occur in which the second base film 210 is broken or torn by the external force applied during the process of producing the adhesive tape 10 and the process of manufacturing the semiconductor package 400, and if the tensile strength is higher than 12 kgf/mm$^2$, it may be difficult for the second base film to change its shape depending on the topology of the bottom surface of the semiconductor package 400. In addition, if the elongation is lower than 8%, it may be difficult for the second base film to change its shape depending on the topology of the bottom surface of the semiconductor package 400, and if the elongation is higher than 12%, it may be difficult for the second base film to continuously maintain the changed shape during the process. Meanwhile, the tensile strength of the second base film 210 may be measured according to Korean Industrial Standard KS B 0801 No. 5, and the elongation may be measured according to Korean Industrial Standard KS B 0802.

As another example, the second base film 210 may include 99 wt % or more of copper (Cu). In addition, the second base film 210 may include, in addition to 99 wt % or more of copper, 1 wt % or less of an additive to control properties of the second base film 210, for example, tensile strength and elongation. The additive may include any one or two or more selected from the group consisting of silicon (Si), iron (Fe), manganese (Mn), magnesium (Mg), zinc (Zn), and titanium (Ti). More specifically, the second base film 210 may include 99.9 wt % or more of aluminum and 0.1 wt % or less of zinc. Here, 99.9 wt % or more of aluminum may refer to a weight percentage of more than or equal to 99.9 wt % and less than 100 wt %, and 0.1 wt % or less of zinc may refer to a weight percentage of less than or equal to 0.1 wt % and more than 0 wt %.

The second base film 210 containing 99 wt % or more of copper may have a tensile strength of at least 10 kgf/mm$^2$ and an elongation of at least 4% so that it may be stably maintained in a taut state without stretching during the process of manufacturing the semiconductor package 400, and at the same time, may change its shape to conform to the topology of the bottom surface of the semiconductor package 400, and may independently maintain the changed shape during the process. More specifically, the second base film 210 containing 99 wt % or more of copper may have a tensile strength ranging from 10 kgf/mm$^2$ to 26 kgf/mm$^2$ and an elongation ranging from 4% to 12%. Here, if the tensile strength is lower than 10 kgf/mm$^2$, a phenomenon may occur in which the second base film 210 is broken or torn by the external force applied during the process of producing the adhesive tape 10 and the process of manufacturing the semiconductor package 400, and if the tensile strength is higher than 26 kgf/mm$^2$, it may be difficult to change the shape so as to conform to the topology of the bottom surface of the semiconductor package 400. In addition, if the elongation is lower than 4%, it may be difficult to change the shape so as to conform to the topology of the bottom surface of the semiconductor package 400, and if the elongation is higher than 12%, it may be difficult to continuously maintain the changed shape during the process. Meanwhile, the tensile strength of the second base film 210 may be measured according to Korean Industrial Standard KS B 0801 No. 5, and the elongation may be measured according to Korean Industrial Standard KS B 0802.

In addition, the second base film 210 may have a surface tension of at least 56 dyne/cm and a surface roughness (Ra) of 0.4 μm or lower in order to easily achieve improvement in the adhesion between the first adhesive layer 120 and the second base film 210, improvement in the adhesion between the second adhesive layer 220 and the second base film 210, a uniform thickness of the second adhesive layer 220 formed on the second base film 210, and a target thickness of the second adhesive layer 220. Here, the surface tension and the surface roughness are values measured for the other surface of the second base film 210, which is in contact with the first adhesive layer 120, and one surface of the second base film 210, which is in contact with the second adhesive layer 220, and the surface roughness means the arithmetic mean roughness.

More specifically, the second base film 210 may have a surface tension ranging from 56 dyne/cm to 72 dyne/cm, and may have a surface roughness ranging from 0.3 μm to 0.4 μm. Herein, if the surface tension is lower than 56 dyne/cm, the adhesion between the first adhesive layer 120, the second adhesive layer 220 and the second base film 210 may be reduced, and it may be difficult to achieve a target thickness of the second adhesive layer 220. On the other hand, if the surface tension is higher than 72 dyne/cm, it may be difficult to form the second adhesive layer 220 having a uniform thickness. In addition, if the surface roughness is lower than 0.3 μm, the adhesion between the first adhesive layer 120, the second adhesive layer 220 and the second base film 210 may be reduced, and if the surface roughness is higher than 0.4 μm, it may reduce the tensile strength and elongation of the second base film 210. The tensile strength, elongation, and surface tension of the second base film 210 may be controlled by adjusting the composition of the materials constituting the second base film 210, that is, the contents (or weight percentages) of 99 wt % or more of a metal element and 1 wt % or less of an additive content.

In addition, the second base film 210 may have a thickness ranging from 10 μm to 35 μm. If the thickness of the second base film 210 is smaller than 10 μm, it may be very difficult for a user to handle the adhesive tape 10. On the other hand, if the thickness of the second base film 210 is larger than 35 μm, it may be difficult for the second base film to change its shape depending on the topology of the semiconductor package 400 bottom surface having the plurality of protruding electrodes 410 formed thereon, and it may be difficult to maintain the stress balance. For reference, if the stress balance cannot be maintained, after the adhesive tape 10 is adhered to the semiconductor package 400, the repulsive force between the semiconductor package 400 and the second adhesive layer 220 increases, and hence the attachment and close adhesion between the semiconductor package 400 and the second adhesive layer 220 may be reduced.

In addition, as the size of the protruding electrodes 410, for example, the diameter of solder balls, is increased in order to further improve the properties of the adhesive tape 10 due to the second base film 210, the thickness of the second base film 210 may decrease within the above-specified thickness range. That is, the thickness of the second base film 210 and the size of the protruding electrodes 410 may be inversely proportional to each other. On the other hand, as the spacing between the protruding electrodes 410 increases, the thickness of the second base film 210 may increase within the above-specified thickness range. That is, the thickness of the second base film 210 and the spacing between the adjacent protruding electrodes 410 may be directly proportional to each other. Accordingly, since the second base film 210 may independently change its shape and maintain the changed shape, it is possible to more effectively improve the stress characteristic, adhesive characteristic and retention characteristic of the adhesive tape 10 for the process of manufacturing the semiconductor package 400, by adjusting the thickness of the second base film 210 together with that of the second adhesive layer 220 depending on changes in the sizes of or spacing between the protruding electrodes 410.

In addition, since the second base film 210 includes a plurality of metal elements, it may change its shape depending on the topology of the bottom surface of the semiconductor package 400, and may maintain the changed form by the second adhesive layer 220 during the process, and at the same time, the second base film 210 may maintain the changed shape by itself. Thereby, it is possible to further improve the adhesive characteristics and retention characteristics of the adhesive tape 10. That is, the second base film 210 may serve to prevent the second adhesive layer 220 from being pushed out from the protruding electrodes 410 during the process, so that the second base film 210 may supplement and improve the adhesive strength of the second adhesive layer 220. Accordingly, even if the adhesive strength of the second adhesive layer 220 is set to a value lower than a normally required adhesive strength (e.g., about 500 gf/25 mm) in order to facilitate the removal of the adhesive tape 10 from the semiconductor package 400 after completion of a predetermined process, the adhesive strength may be supplemented by the second base film 210. For reference, the shape of the base film including a polymer material is also changed depending on the topology of the bottom surface of the semiconductor package 400 when the adhesive tape is attached to the semiconductor package, but this shape change is due to the adhesive layer and is not due to the polymer material itself.

In addition, as shown in FIG. 3a, the second base film 210 may have a flat planar shape. Alternatively, as shown in FIG. 3b, the second base film 210 may have a mesh type planar shape including a plurality of perforated holes passing through the second base film 210. Here, the plurality of perforated holes 212 are regularly arranged in the second base film 210, and the size of each of the plurality of perforated holes 212 may be 1% to 3% of the size of the protruding electrode 410 so that the physical properties of the second base film 201, such as tensile strength and elongation, required for the adhesive tape 10, are not deteriorated. In addition, the planar shape of each of the plurality of performed holes 212 may be any one shape selected from the group consisting of a triangular or higher polygonal shape, an oval shape, and a circular shape.

As shown in FIG. 3b, when the second base film 210 has the plurality of perforated holes 212, the first adhesive layer 120 and the second adhesive layer 220 may be in direct contact through the plurality of perforated holes formed in the second base film 210. Accordingly, it is possible to enhance the adhesion between the first tape 100 and the second tape 200, and even if an air gap occurs between the semiconductor package 400 and the adhesive tape 10 in a region where the bottom surface of the semiconductor package 400 and the protruding electrode contact each other, it is possible to effectively prevent the air gap from excessively expanding during the process (in particular, during a process in a high vacuum environment). This is because the continuity of molecular structure (i.e., spiral network structure) between the first adhesive layer 120 and the second adhesive layer 220 can be provided through the plurality of perforated holes 212.

Meanwhile, when a base film includes a polymer material, the polymer material which is used for an adhesive layer is not easy to mix and stir with and adhere to a different material, due to its unique chemical stability, and hence separate surface treatment is performed on the base film. However, since the second base film 210 contains a plurality of metal elements, it has high adhesion to the first adhesive layer 120 containing silicone and the second adhesive layer 220, and does not require separate surface treatment. Thereby, it is possible to improve productivity and reduce process costs.

In the first embodiment, the first adhesive layer 120 and the second adhesive layer 220 may have a configuration in which they are adhered to the semiconductor package bottom surface following the topology of the semiconductor package 400 bottom surface having the plurality of protruding electrodes 410 formed thereon while the thickness thereof is maintained constant as possible. More specifically, the first adhesive layer 120 and the second adhesive layer 220 are adhered to the semiconductor package bottom surface following the topology of the semiconductor package 400 bottom surface having the plurality of protruding electrodes 410 formed thereon, but the first adhesive layer 120 may have a configuration in which the plurality of protruding electrodes 410 are impregnated therein, and the second adhesive layer 220 may be configured to surround the plurality of protruding electrodes 410.

Since the first tape 100 serves to prevent damage to the second tape 200 during the process, facilitate handling of the second tape 200 having a relatively small thickness, and provide a cushion for the protruding electrodes 410, the first adhesive layer 120 may have a larger thickness than the second adhesive layer 220. In addition, since the first tape 100 substantially acts as a base film for the second tape 200, the adhesive strength of the first adhesive layer 120 may be greater than that of the second adhesive layer 220. More specifically, the first adhesive layer 120 has a thickness ranging from 100 μm to 700 μm so that the protruding electrodes 410 may be impregnated therein, and an adhesive strength of at least 500 gf/25 mm, for example, an adhesive strength ranging from 500 gf/25 mm to 2500 gf/25 mm. In addition, the second adhesive layer 220 may have a thickness ranging from 10 μm to 50 μm and an adhesive strength ranging from 200 gf/25 mm to 300 gf/25 mm.

If the thickness of the first adhesive layer 120 is smaller than 100 μm, the ability of the adhesive tape 10 to provide a cushion for the protruding electrodes 410 during the process by impregnating the protruding electrodes 410 may be lowered, and if the thickness of the first adhesive layer 120 is larger than 700 μm, the adhesion, sealing and retention characteristics thereof between the bottom surface of the semiconductor package 400 and the adhesive tape 10 may be deteriorated. In addition, if the adhesive strength of the first adhesive layer 120 is lower than 500 gf/25 mm, a defect in which the first tape 100 is peeled off from the second tape 200 may occur when the adhesive tape 10 is removed from the semiconductor package. On the other hand, if the adhesive strength of the first adhesive layer 120 is higher than 2500 gf/25 mm, it may be difficult to achieve the thickness of the first adhesive layer 120 required for the adhesive tape 10. This is because the adhesive strength of the adhesive layer containing silicone has a characteristic that is discontinuously proportional to the thickness of the adhesive layer. For reference, the adhesive strength of the first adhesive layer 120 may refer to an initial adhesive strength at the bonding interface at which the first adhesive layer 120 and the second base film 210 are in contact with each other.

The first adhesive layer 120 may have a thickness ranging from 100 μm to 700 μm, and as the size of the protruding electrodes 410 increases, the thickness of the first adhesive layer 120 may be reduced within the specified thickness range. This is because the surface area of the protruding electrode 410 increases as the size of the protruding electrode 410 increases, and thus the second tape 200, particularly the second base film 210 composed of a thin metal film, is less likely to be damaged during a pressing process for attachment and close adhesion between the semiconductor package 400 and the adhesive tape 10. On the other hand, the first adhesive layer 120 may have a thickness ranging from 100 μm to 700 μm, and as the spacing between the protruding electrodes 410 increases, the thickness of the first adhesive layer 120 may be increased within the specified thickness range. This is because, as the spacing between the protruding electrodes 410 increases, the external force (i.e., pressure) applied during pressing for attachment and close adhesion between the semiconductor package 400 and the adhesive tape 10 needs to be increased. That is, this is because, as the external force applied during the pressing increases, the second tape 200, particularly the second base film 210 composed of a thin metal film, is more likely to be damaged.

The second adhesive layer 220 may have a thickness ranging from 10 μm to 50 μm so that it may be tightly adhered to the semiconductor package bottom surface following the topology of the semiconductor package 400 bottom surface having the protruding electrodes 410 formed thereon. Here, if the thickness of the second adhesive layer 220 is smaller than 10 μm, it may be difficult to secure the required adhesive strength, and if the thickness of the second adhesive layer 220 is larger than 50 μm, it may be difficult to remove the adhesive tape 10 after completion of the process, or the second adhesive layer 220 may be pushed out to the side of the semiconductor package 400 by pressing down during attachment, causing a deposition defect of an EMI shielding layer. As such, the second adhesive layer 220 may have a thickness ranging from 10 μm to 50 μm, and in this case, the stress balance in the second adhesive layer 220 may be maintained, thus improving the adhesive characteristics and retention characteristics, and it is possible to prevent an air gap from occurring between the semiconductor package 400 and the adhesive tape 10 in a region where the bottom surface of the semiconductor package 400 and the protruding electrode 410 contact each other.

In addition, the second adhesive layer 220 may have a thickness ranging from 10 μm to 50 μm, and as the size of the protruding electrode 410 increases, the thickness may increase within the specified range, and as the spacing between the protruding electrodes 410 increases, the thickness may decrease within the specified range. As the thickness of the second adhesive layer 220 is adjusted depending on changes in the size of and spacing between the protruding electrodes 410, it is possible to more effectively improve the adhesive characteristics, removal characteristics and retention characteristics of the adhesive tape 10 for the semiconductor package 400 manufacturing process.

In addition, the second adhesive layer 220 may have an adhesive strength ranging from 200 gf/25 mm to 300 gf/25 mm to secure adhesive characteristics, retention characteristics and removal characteristics. Here, if the adhesive strength of the second adhesive layer 220 is lower than 200 gf/25 mm, a phenomenon may occur in which the second adhesive layer 220 is pushed out from the bottom surface of the semiconductor package 400 or from the plurality of protruding electrodes 410 formed on the bottom surface of the semiconductor package 400 in a process environment for forming an EMI shielding layer, for example, in a high-temperature and high-vacuum environment, or gases and particles may penetrate between the adhesive tape 10 and the adhesion surface of the semiconductor package 400 during the process. On the other hand, if the adhesive strength of the second adhesive layer 220 is higher than 300 gf/25 mm, the adhesive tape 10 may not be easily removed in the process of removing the adhesive tape 10 at room temperature and atmospheric pressure after completion of the process of forming an EMI shielding layer, or the adhesive material may remain on the bottom surface of the semiconductor package 400 and the surface of the protruding electrode 410.

In the first embodiment, each of the first adhesive layer 120 and the second adhesive layer 220 may be composed of a silicone material which can maintain its chemical resistance, heat resistance and cold resistance, has no outgassing, is soft to impregnate the protruding electrodes 410, is not modified, and can be detached without leaving residue. Specifically, each of the first adhesive layer 210 and the second adhesive layer 220, which contain silicone, may be based on a siloxane bond as a main skeleton. More specifically, the first adhesive layer 210 and the second adhesive layer 220 may be based on a siloxane bond as a main skeleton, and may have a spiral network molecular structure so that, even if an air gap occurs between the semiconductor package 400 and the adhesive tape 10 in a region where the bottom surface of the semiconductor package 410 and the protruding electrode 410 contact each other, it is possible to prevent the air gap from excessively expanding during the process (in particular, during a process in a high vacuum environment). For reference, the first adhesive layer 120 and the second adhesive layer 220, which are based on a siloxane bond as a main skeleton, may have a spiral network structure having a wide intermolecular spacing depending on the number and types of functional groups bound to the side chain of the siloxane bond, and thus it is possible to prevent the air gap from excessively expanding through the space between molecules together with the spiral network structure in a high-vacuum environment.

Here, the siloxane bond is composed of silicon (Si) and oxygen (O) connected to each other, and can secure excellent heat resistance and chemical resistance due to large binding energy between silicon (Si) and oxygen (O). In addition, the siloxane bond has an amorphous molecular structure which makes it difficult to form a crystal structure, and thus it may secure excellent cold resistance due to its low glass transition point. When molecules approach each other, an attraction between the molecules acts to form a kind of bonding state, and the siloxane bond may have a low glass transition point because the attraction between the molecules in the siloxane bond is small. Due to this molecular structure, the first adhesive layer 120 and the second adhesive layer 220, which are based on the siloxane bond as a main skeleton are difficult to harden, and show a small temperature-dependent change in the viscosity thereof, and thus may exhibit stable physical properties over a wide temperature range.

In order to easily achieve the above-described thickness, adhesive strength and molecular structure of each of the first adhesive layer 120 and the second adhesive layer 220, each of the first adhesive layer 120 and the second adhesive layer 220 may include an adhesive composition containing an adhesive base agent composed of a mixture of trimethylated silica, a dimethyl siloxane copolymer and ethylbenzene. Here, the dimethyl siloxane copolymer may also include a dimethyl siloxane block copolymer. In the adhesive base agent, trimethylated silica may serve to control the adhesive strength depending on the content thereof, and the dimethyl siloxane copolymer may serve to provide a siloxane bond as a main skeleton. In addition, ethylbenzene may serve to produce an intermediate product to facilitate bonding between trimethylated silica, the dimethyl siloxane copolymer, and other additives.

Hereinafter, a plurality of adhesive compositions (i.e., first to sixth adhesive compositions) applicable to the first adhesive layer 120 and the second adhesive layer 220 of the adhesive tape 10 according to an embodiment of the present disclosure will be described in detail. Here, each of the first adhesive layer 120 and the second adhesive layer 220 may have either a single layer structure composed of any one of the first to sixth adhesive compositions or a multilayer structure composed of two or more of the first to sixth adhesive compositions.

First, the first adhesive composition may contain, based on 100 parts by weight of the first adhesive base agent, 0.5 to 1.5 parts by weight of a crosslinker, 0.5 to 1.5 parts by weight of an anchorage additive, and 0.5 to 1.5 parts by weight of a catalyst. When the first adhesive layer 120 and the second adhesive layer 220 are formed to have a thickness ranging from 100 μm to 250 μm and a thickness ranging from 10 μm to 20 μm, respectively, the first adhesive composition may be used.

Specifically, the first adhesive base agent may include a mixture of the following components mixed together at a predetermined ratio: toluene; xylene; ethylbenzene; 1-ethynylcyclohexanol (CAS No. 78-27-3); trimethylated silica; siloxanes and silicones, di-Me, vinyl group-terminated (CAS No. 68083-19-2); dimethyl, methylvinyl siloxane, hydroxy-, vinyl-terminated (CAS No. absent); dimethyl, methylvinyl siloxane, dimethylvinyl-terminated (CAS. N. 68083-18-1); and siloxanes and silicones, di-Me, Me vinyl, hydroxy-terminated (CAS No. 67923-19-7). Here, 1-ethynylcyclohexanol may serve to control the curing rate, and toluene and xylene may be used as a solvent. In addition, siloxanes and silicones, di-Me, vinyl group-terminated; dimethyl, methylvinyl siloxane, hydroxy-, vinyl-terminated; dimethyl, methylvinyl siloxane, dimethylvinyl-terminated; and siloxanes and silicones, di-Me, Me vinyl, hydroxy-terminated may be dimethylsiloxane copolymers.

More specifically, the proportions of the components included in the first adhesive base agent are as follows: toluene: 20% to 25%; xylene: 10% to 20%; ethylene benzene: 2.5% to 10%; 1-ethynylcyclohexanol: 0.1% to 1%; trimethylated silica: 30% to 40%; siloxanes and silicones, di-Me, vinyl group-terminated: 10% to 20%; dimethyl, methylvinyl siloxane, hydroxy-, vinyl-terminated: 1% to 10%; dimethyl, methylvinyl siloxane, dimethylvinyl-terminated: 1% to 10%; and siloxanes and silicones, di-Me, Me vinyl, hydroxy-terminated: 1% to 10%.

The crosslinker may serve to control the crosslinking and curing reaction by reaction with the adhesive base agent, and help to more easily form a spiral network structure in the adhesive composition. As the crosslinker, a crosslinker mixture composed of heptane and siloxanes and silicones, Me hydrogen (CAS No. 63148-57-2), mixed together at a predetermined ratio, may be used. The proportions of the components included in the crosslinker mixture are as follows: heptane: 0.25% to 1%; and siloxanes and silicones, Me hydrogen: 99% to 99.75%.

The anchorage additive may serve to provide adhesion between the silicone and the substrate. As the anchorage additive, an anchorage mixture of the following components mixed together at a predetermined ratio may be used: trimethoxy[3-(oxiranylmethoxy)propyl]silane (CAS No. 2530-83-8); siloxanes and silicones, di-Me, Me vinyl, hydroxy-terminated reaction products with trimethoxy[3-oxiranylmethoxy)propyl]silane (CAS No. 102782-94-5); methanol; and divinyl hexamethyl cyclotetrasiloxane (CAS No. 17980-61-9). The proportions of the components included in the anchorage mixture may be as follows: trimethoxy[3-(oxiranylmethoxy)propyl]silane: 30% to 40%; siloxanes and silicones, di-Me, Me vinyl, hydroxy-terminated reaction products with trimethoxy[3-oxiranylmethoxy)propyl]silane: 60% to 70%; methanol: 1% to 3%; and divinyl hexamethyl cyclotetrasiloxane: 1% to 2.5%.

The catalyst may serve to help the reaction, curing and crosslinking operations proceed even at low temperatures or under mild conditions by reducing the reaction activation energy. As the catalyst, a platinum catalyst may be used. Specifically, as the catalyst, a catalyst mixture of the following components mixed together at a predetermined ratio may be used: platinum 1,3-diethenyl-1,1,3,3-tetramethyldisiloxane complexes (CAS No. 68478-92-2); siloxanes and silicones, di-Me, vinyl group-terminated (CAS No. 68083-19-2); tetramethyldivinyldisiloxane (CAS No. 2627-95-4); and siloxanes and silicones, di-Me, hydroxy-terminated (CAS No. 70131-67-8). The proportions of the components included in the catalyst mixture may be as follows: platinum 1,3-diethenyl-1,1,3,3-tetramethyldisiloxane complexes: 1% to 10%; siloxanes and silicones, di-Me, vinyl group-terminated: 90% to 99%; tetramethyldivinyldisiloxane: 1% to 10%; and siloxanes and silicones, di-Me, hydroxy-terminated: 1% to 10%.

Meanwhile, the second adhesive composition may contain, based on 100 parts by weight of the second adhesive base agent, 0.5 to 1.5 parts by weight of a crosslinker, 0.5 to 1.5 parts by weight of an anchorage additive, and 0.5 to 1.5 parts by weight of a catalyst. Here, the crosslinker, the anchorage additive and the catalyst may be the same as those described above. When the first adhesive layer 120 and the second adhesive layer 220 are formed to have a thickness ranging from 200 μm to 400 μm and a thickness ranging from 20 μm to 30 μm, respectively, the second adhesive composition may be used.

Specifically, as the second adhesive base agent, a mixture of the following components mixed together at a predetermined ratio may be used: xylene; trimethylated silica; ethylbenzene; and siloxanes and silicones, di-Me, vinyl group-terminated (CAS No. 68083-19-2). Here, xylene may be used as a solvent, and siloxane and siloxanes and silicones, di-Me, vinyl group-terminated may be a dimethyl siloxane copolymer. More specifically, the proportions of the components included in the second adhesive base agent may be as follows: xylene: 29% to 37%; trimethylated silica: 29% to 34%; ethylbenzene: 9% to 11%; and siloxanes and silicones, di-Me, vinyl group-terminated: 21% to 24%.

Meanwhile, the third adhesive composition may contain, based on 100 parts by weight of the second adhesive base agent, 0.5 to 1.5 parts by weight of a crosslinker agent, 0.5 to 1.5 parts by weight of an anchorage additive, and 0.8 to 1.8 parts by weight of a catalyst. Here, the crosslinker, the anchorage additive and the catalyst may be the same as those described above. When the first adhesive layer 120 and the second adhesive layer 220 are formed to have a thickness ranging from 400 μm to 550 μm and a thickness ranging from 30 μm to 40 μm, respectively, the third adhesive composition may be used.

Meanwhile, the fourth adhesive composition may contain, based on 100 parts by weight of the third adhesive base agent composed of the first and second adhesive base agents mixed together at a ratio of 95:1 to 99:1, 0.5 to 1.5 parts by weight of a crosslinker, 0.5 to 1.5 parts by weight of an anchorage additive, and 0.5 to 1.5 parts by weight of a catalyst. Here, the crosslinker, the anchorage additive and the catalyst may be the same as those described above. When the first adhesive layer 120 and the second adhesive layer 220 are formed to have a thickness ranging from 550 μm to 700 μm and a thickness ranging from 40 μm to 50 μm, respectively, the third adhesive composition may be used.

Specifically, the first base agent in the third adhesive base agent may include a mixture of the following components mixed together at a predetermined ratio: xylene; trimethylated silica; ethylbenzene; and siloxanes and silicones, di-Me, vinyl group-terminated (CAS No. 68083-19-2). Here, xylene may be used as a solvent, and siloxanes and silicones, di-Me, vinyl group-terminated may be a dimethyl siloxane copolymer. More specifically, the proportions of the components included in the first base agent may be as follows: xylene: 29% to 37%; trimethylated silica: 29% to 34%; ethylbenzene: 9% to 11%; and siloxanes and silicones, di-Me, vinyl group-terminated: 21% to 24%.

The second base agent in the third adhesive base agent may serve to control the adhesive strength, and may include a mixture of the following mixture mixed together at a predetermined ratio: siloxanes and silicones, di-Me, vinyl group-terminated (CAS No. 68083-19-2); and 1-ethynylcyclohexanol (CAS No. 78-27-3). Here, 1-ethynylcyclohexanol may serve to control the curing rate, and siloxanes and silicones, di-Me, vinyl group-terminated may be a dimethyl siloxane copolymer. More specifically, the proportions of the components included in the second base agent may be as follows: siloxanes and silicones, di-Me, vinyl group-terminated: 99% to 99.9%; and 1-ethynylcyclohexanol: 0.1% to 1%.

Meanwhile, the fifth adhesive composition may contain, 100 parts by weight of the fourth adhesive base agent composed of the third base agent and the fourth base agent mixed together at a ratio of 50:50 to 80:20, 0.5 to 3 parts by weight of a polymerization initiator. For example, the fifth thickness may have a thickness ranging from 20 μm to 40 μm. When the first adhesive layer 120 and the second adhesive layer 220 are formed to have a thickness ranging from 250 μm to 550 μm and a thickness in a range of 20 μm to 40 μm, respectively, the fifth adhesive composition may be used.

Specifically, the third base agent in the fourth adhesive base agent may include a mixture of the following components mixed together at a predetermined ratio: xylene; ethylbenzene; toluene; and siloxanes and silicones, di-Me, hydroxy-terminated reaction products with chlorotrimethylsilane, hydrochloric acid, iso-Pr alc. and sodium silicate (CAS No. 68440-70-0). Here, the siloxanes and silicones, di-Me, hydroxy-terminated reaction products with chlorotrimethylsilane, hydrochloric acid, iso-Pr alc. and sodium silicate may be a reaction product in which trimethylated silica and a dimethyl siloxane copolymer are combined together in a pre-crosslinked form. More specifically, the proportions of the components included in the first base agent may be as follows: xylene: 30% to 40%; ethylbenzene: 2.5% to 10%; toluene: 0.1% to 0.25%; siloxanes and silicones, di-Me, hydroxy-terminated reaction products with chlorotrimethylsilane, hydrochloric acid, iso-Pr alc. and sodium silicate: 50% to 60%.

The fourth base agent in the fourth adhesive base agent may serve to control the adhesive strength, and may include a mixture of the following components mixed together at a predetermined ratio: toluene; siloxanes and silicones, di-Me, hydroxy-terminated (CAS No. 70131-67-8); xylene; trimethylated silica; and ethylbenzene. Here, toluene and xylene may be used as a solvent, and the siloxanes and silicones, di-Me, hydroxy-terminated may be a dimethyl siloxane copolymer. More specifically, the proportions of the components included in the second base agent may be as follows: toluene: 70% to 80%; siloxanes and silicones, di-Me, hydroxy-terminated: 10% to 20%; xylene: 1% to 10%; trimethylated silica: 1% to 10%; and ethylbenzene: 0.25% to 1%.

The polymerization initiator refers to a material that causes a chain polymerization reaction, and benzoyl peroxide may be used as the polymerization initiator.

Meanwhile, the sixth adhesive composition may contain, based on 100 parts by weight of the fifth adhesive base agent composed of the third and fifth base agents mixed together at a ratio of 50:50 to 80:20, 0.5 to 3 parts by weight of a polymerization initiator. As the polymerization initiator, benzoyl peroxide may be used. When the first adhesive layer 120 and the second adhesive layer 220 are formed to have a thickness ranging from 250 μm to 550 μm and a thickness ranging from 20 μm to 40 μm, respectively, the sixth adhesive composition may be used.

Specifically, the third base agent in the fifth adhesive base agent may include a mixture of the following components mixed together at a predetermined ratio: xylene; ethylbenzene; toluene; and siloxanes and silicones, di-Me, hydroxy-terminated reaction products with chlorotrimethylsilane, hydrochloric acid, iso-Pr alc. and sodium silicate. Here, the siloxanes and silicones, di-Me, hydroxy-terminated reaction products with chlorotrimethylsilane, hydrochloric acid, iso-Pr alc. and sodium silicate may be a reaction product in which trimethylated silica and a dimethyl siloxane copolymer are combined together in a pre-crosslinked form. More specifically, the proportions of the components included in the third base agent may be as follows: xylene: 30% to 40%; ethylbenzene: 2.5% to 10%; toluene: 0.1% to 0.25%; and siloxanes and silicones, di-Me, hydroxy-terminated reaction products with chlorotrimethylsilane, hydrochloric acid, iso-Pr alc. and sodium silicate: 50% to 60%.

The fifth base agent in the fifth adhesive base agent may serve to control the adhesive strength, and may include a mixture of the following components mixed together at a predetermined ratio: toluene; siloxanes and silicones, di-Me, Me vinyl, vinyl group-terminated (CAS No. 68083-18-1); xylene; trimethylated silica; ethylbenzene; siloxanes and silicones, di-Me, Me vinyl, hydroxy-terminated (CAS No. 67923-19-7); and 1-ethynylcyclohexanol (CAS No. 78-27-3). Here, the siloxanes and silicones, di-Me, Me vinyl, vinyl group-terminated may be a dimethyl siloxane copolymer. More specifically, the proportions of the components included in the fifth base agent may be as follows: toluene: 47% to 63%; siloxanes and silicones, di-Me, Me vinyl, vinyl group-terminated: 21% to 31%; xylene: 2.3% to 3.1%; trimethylated silica: 10% to 14%; ethylbenzene: 0.44% to 0.6%; siloxanes and silicones, di-Me, Me vinyl, hydroxy-terminated: 2.2% to 3%; and 1-ethynylcyclohexanol: 0.14% to 0.18%.

The adhesive tape 10 according to the first embodiment may include a release film 300 attached onto the second adhesive layer 220. The release film 300 may facilitate storage and transportation of the adhesive tape 10, and may serve to protect the second adhesive layer 220 before the process of manufacturing the semiconductor package 400. The release film 300 may contain fluorine to protect the silicone-containing second adhesive layer 220 and to facilitate the removal of the release film 300 from the second adhesive layer 220, and may have an adhesive strength ranging from 3 gf/25 mm to 8 gf/25 mm. If the adhesive strength of the release film 300 is lower than 3 gf/25 mm, the release film 300 may be naturally peeled off, and if the adhesive strength of the release film 300 is higher than 8 gf/25 mm, the adhesive tape 10 may be damaged in the process of removing the release film 300 from the adhesive tape 10, or it may be difficult to remove the release film 300.

As described above, the adhesive tape 10 for a semiconductor package 400 manufacturing process according to the first embodiment has a very simple structure in which the first base film 110, the first adhesive layer 120, the second base film 210 and the second adhesive layer 220 are sequentially laminated. Thus, the adhesive tape 10 may improve productivity and price competitiveness.

In addition, since the first base film 110 includes either a single layer structure composed of any one layer selected from the group consisting of a polyethylene terephthalate (PET) layer, a polyimide (PI) layer and a polyolefin (PO) layer or a multilayer structure composed of two or more of these layers, it is possible to easily secure the stress characteristics required for the adhesive tape 10 for a semiconductor package 400 manufacturing process, which is used in a process of forming an EMI shielding layer.

In addition, when the first base film 110 including a polymer material is composed of a polymer material, surface treatment is performed on one surface of the first base film 110, which is in contact with the first adhesive layer 120, and thus the adhesive force between them may be improved, even when a silicone material is used for the first adhesive layer 120.

In addition, since the first base film 110 including a polymer material has a thickness ranging from of 10 µm to 150 µm, there are advantages in that the adhesive tape 10 is easy to handle while the stress balance may be effectively maintained depending on the topology of the semiconductor package 400 bottom surface having the plurality of protruding electrodes 410 formed thereon.

In addition, since the second base film 210 changes in shape so as to conform to the topology of the bottom surface of the semiconductor package 400 and contains a metal element so that it can retain the changed shape during the process, it is possible to easily secure the adhesive characteristics and retention properties required for the adhesive tape 10 for a semiconductor package 400 manufacturing process, which is used in the process of forming an EMI shielding layer. In addition, when the first base film 110 contains a metal element in the same manner as the second base film 210, it is possible to more easily secure the above-described adhesive characteristics and retention characteristics.

In addition, since the second base film 210 containing a metal element has a very small thickness ranging from 10 µm to 35 µm, the stress balance may be effectively maintained depending on the topology of the semiconductor package 400 bottom surface having the plurality of protruding electrodes 410 formed thereon.

In addition, as the molecular structure continuity between the first adhesive layer 120 and the second adhesive layer 220 is realized through the plurality of perforated holes 212 formed in the second base film 210, even when an air gap occurs between the semiconductor package 400 and the adhesive tape 10 in a region where the bottom surface of the semiconductor package 400 and the protruding electrode 410 contact each other, it is possible to prevent the air gap from expanding excessively during the process (especially during a process in a high vacuum environment), In addition, since each of the first adhesive layer 120 and the second adhesive layer 220 includes an adhesive base agent composed of a mixture of trimethylated silica, dimethylsiloxane copolymer and ethylbenzene, the physical properties thereof are not changed by the heat generated during the process of forming an EMI shielding layer, and it is possible to easily secure the adhesive characteristics, retention properties, removal properties and stress characteristics required for the adhesive tape 10 for a semiconductor package 400 manufacturing process.

In addition, since each of the first adhesive layer 120 and the second adhesive layer 220 has a spiral network structure based on a siloxane bond as a main skeleton, even when an air gap occurs between the semiconductor package 400 and the adhesive tape 10 in a region where the bottom surface of the semiconductor package 400 and the protruding electrode 410 contact each other, it is possible to prevent the air gap from expanding excessively during the process (particularly, during a process in a high vacuum environment).

In addition, since the second adhesive layer 220 has a very small thickness ranging from 10 µm to 50 µm, it is easily attached and adhered closely to the bottom surface of the semiconductor package following the topology of the bottom surface having the plurality of protruding electrodes 410 formed thereon, and it is possible to prevent the second adhesive layer 220 from being pushed up to the edge side of the semiconductor package 400 after attachment.

In addition, as the thickness of each of the first adhesive layer 120 and the second adhesive layer 220 and the thickness of each of the first base film 110 and the second base film 210 are optimized depending on the size of and spacing between the protruding electrodes 410 of the semiconductor package 400, it is possible to more effectively secure the adhesive characteristics, retention characteristics, removal characteristics and stress characteristics required for the adhesive tape 10 for a semiconductor package 400 manufacturing process, which is used in a process of forming an EMI shielding layer.

In addition, since it is possible to reduce the number of process steps and the consumption of consumables compared to a conventional process of forming an EMI shielding layer on the semiconductor package 400, it is possible to improve the productivity of the semiconductor package 400.

For reference, in a conventional process of forming an EMI shielding layer on the semiconductor package 400, a thick UV curing tape having a thickness larger than the size of each protruding electrode 410 is attached onto a semiconductor wafer having the plurality of protruding electrodes 410 formed thereon so that the plurality of protruding electrodes 410 are impregnated therein, and then UV irradiation is performed to control the adhesiveness of the UV curing tape. Subsequently, after a dicing tape is attached onto the UV curing tape, sawing is performed on the semiconductor wafer up to the UV curing tape to separate the semiconductor wafer into individual die, that is, the semiconductor packages 400. That is, at the time the sawing process is completed, the thick UV curing tape remains attached to the semiconductor package. Thereafter, a single-sided adhesive heat resistant tape (or carrier tape) is fixed to a separate frame, and then individual semiconductor packages 400 separated from the dicing tape are adhered to the heat resistant tape at intervals of approximately 2 mm so that the UV curing tape is in contact with the adhesive surface of the heat resistant tape. Next, pre-baking is performed to remove impurities remaining in the UV curing tape. At this time, the impurities refer to materials outgassed from the UV curing tape in a subsequent process environment for depositing an EMI shielding layer, that is, a high-temperature and high-vacuum environment, and this is because the UV curing tape is based on an acrylic polymer. The pre-baking is a process for removing these impurities in advance. Next, the process of depositing an EMI shielding layer, that is, a sputtering process, is performed in a state in which the semiconductor package 400 is attached to the heat-resistant tape, followed by a series of processes in which the UV curing tape and heat-resistant tape attached to the semiconductor package 400 bottom surface having the plurality of protruding electrodes 410 formed thereon are removed using a vacuum chuck or lift pin provided in an automated facility.

On the contrary, in a process of forming an EMI shielding layer on the semiconductor package 400 using the adhesive tape 10 according to the first embodiment described above, a dicing tape is attached to a surface opposite to one surface of a semiconductor wafer, which has the plurality of protruding electrodes 410 formed thereon, and then sawing is performed only on the semiconductor wafer to separate the semiconductor wafer into individual dies, that is, the semiconductor packages 400. Next, the adhesive tape 10 according to the embodiment of the present disclosure is fixed to a separate frame, and then the semiconductor packages 400 separated from the dicing tape are adhered to the adhesive surface of the adhesive tape 10 at intervals of approximately 2 mm so that the protruding electrodes 410 is in contact with the adhesive surface of the adhesive tape 10. Next, a process of depositing an EMI shielding layer, that is, a sputtering process, is performed in a state in which the semiconductor package 400 is attached to the adhesive tape 10, followed by a series of processes in which the adhesive tape 10 attached to the semiconductor package 400 bottom surface having the plurality of protruding electrodes 410 formed thereon, are removed using a vacuum chuck or lift pin provided in an automated facility.

That is, as described above, the process of forming an EMI shielding layer on the semiconductor package 400 using the adhesive tape 10 according to the first embodiment of the present disclosure does not require the conventional UV curing tape, and thus it is possible to reduce the production cost by reducing the consumption of consumables, and it is possible to reduce the number of process steps by omitting the pre-baking process.

Mode for Invention

Figure 4:
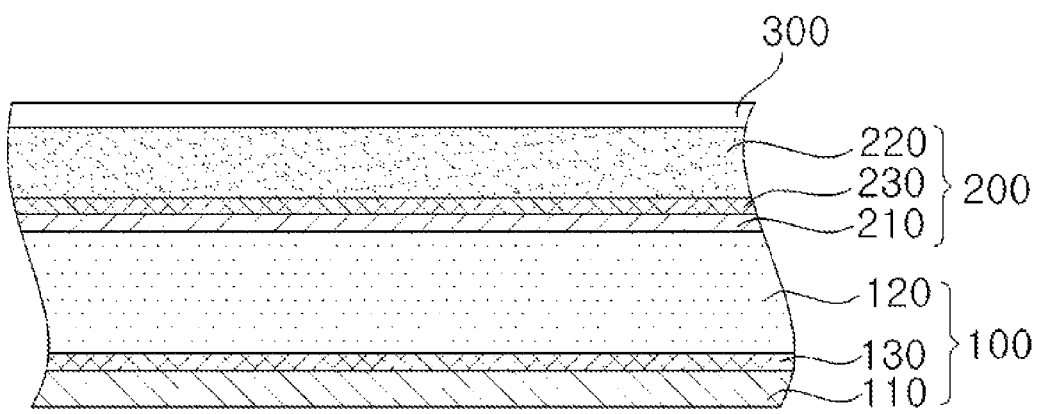
FIG. 4 is a view schematically showing a section of the adhesive tape for a semiconductor package manufacturing process according to the second embodiment of the present disclosure.

FIG. 4 is a view schematically showing a section of an adhesive tape for a semiconductor package manufacturing process according to a second embodiment of the present disclosure. Hereinafter, for convenience of explanation, the same components as those of the first embodiment described above will be denoted by the same reference numerals, and detailed descriptions thereof will be omitted.

As shown in FIG. 4, the adhesive tape 20 for a semiconductor package 400 manufacturing process according to the second embodiment of the present disclosure may have a structure in which a first base film 110, a first intermediate layer 130, a first adhesive layer 120, a second base film 210, a second intermediate layer 230, a second adhesive layer 220, and a release film 300 are sequentially laminated in this order. Here, the first base film 110, the first adhesive layer 120, the second base film 210, the second adhesive layer 220 and the release film 300 have the same components as those of the first embodiment described above, and thus detailed description thereof will be omitted. In addition, the base film to be described later may refer to both the first base film 110 and the second base film 210, and the adhesive layer to be described later may refer to both the first adhesive layer 120 and the second adhesive layer 220.

Each of the first intermediate layer 130 and the second intermediate layer 230 is an intermediate material interposed between the base film and the adhesive layer, which are composed of different materials, and may serve to improve the adhesion between the base film and the adhesive layer. Thus, each of the first intermediate layer 130 and the second intermediate layer 230 may be obtained using an adhesive composition having excellent physical and chemical bonding strength with both the base film including a polymer material or a metal material and the adhesive layer containing silicone.

Specifically, the adhesive composition used for each of the first intermediate layer 130 and the second intermediate layer 230 has a molecular structure which is a spiral network structure, like the first adhesive layer 120 and the second adhesive layer 220, and may contain silicone. More specifically, the adhesive composition used for each of the first intermediate layer 130 and the second intermediate layer 230 may be a primer mixture of: toluene; siloxanes and silicones, di-Me, hydroxy-terminated (CAS No. 70131-67-8); xylene; trimethylated silica; and ethylbenzene. Here, the proportions of the components in the primer mixture may be as follows: toluene: 70% to 80%; siloxanes and silicones, di-Me, hydroxy-terminated: 10% to 20%; xylene: 1% to 2.5%; trimethylated silica: 1% to 10%; and ethylbenzene: 0.25% to 1%.

Each of the first intermediate layer 130 and the second intermediate layer 230 may have a basis weight ranging from 0.2 $g/m^2$ to 0.5 $g/m^2$ on the base film. If the basis weight of each of the first intermediate layer 130 and the second intermediate layer 230 is less than 0.2 $g/m^2$, it is not possible to provide sufficient adhesion between the base film and the adhesive layer, and if the basis weight is more than 0.5 $g/m^2$, a defect in which the base film and the adhesive layer are separated with respect to the first intermediate layer 130 and the second intermediate layer 230 may occur during the process of removing the adhesive tape 20.

As the adhesive tape 20 according to the second embodiment of the present disclosure further includes the first intermediate layer 130 and the second intermediate layer 230 described above, it is possible to further enhance the adhesion between the base film and the adhesive layer, even when a silicone material is used for the adhesive layer.

Figure 5:
FIG. 5 is a flow chart showing a process of producing an adhesive tape for a semiconductor package manufacturing process according to an embodiment of the present disclosure.
Figure 6:
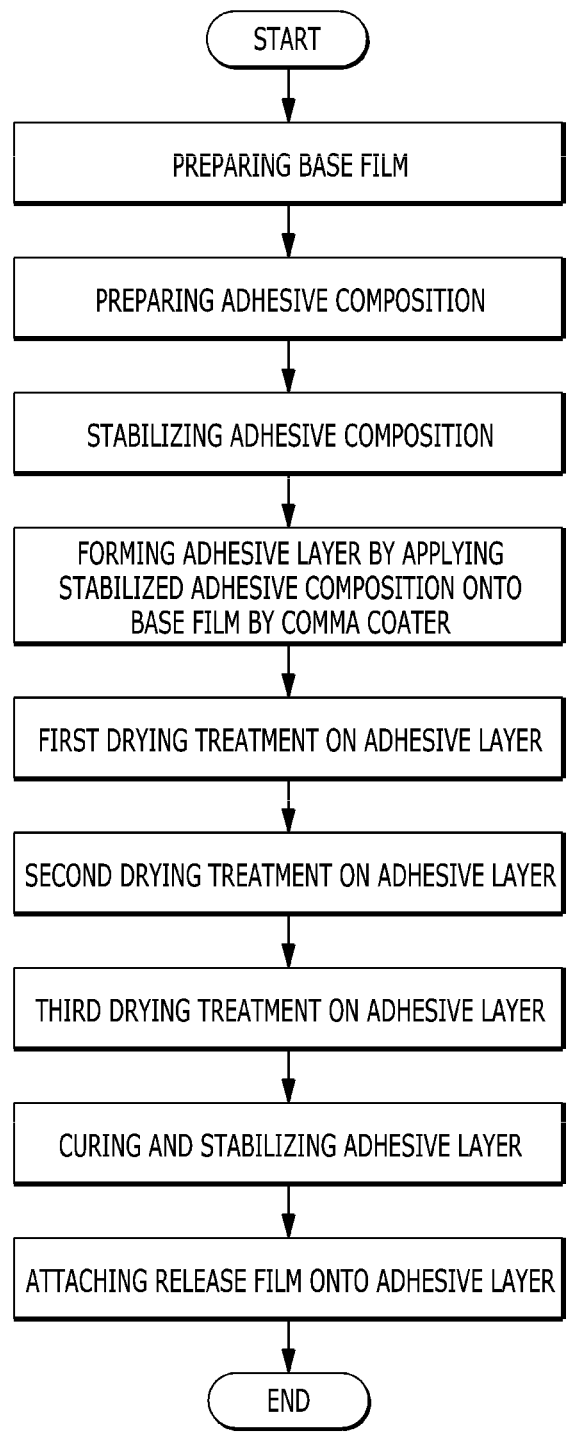
FIG. 6 is a flow chart showing a process of producing a first tape and a second tape in the adhesive tape for a semiconductor package manufacturing process according to an embodiment of the present disclosure.

FIG. 5 is a flow chart showing a process of producing an adhesive tape for a semiconductor package manufacturing process according to an embodiment of the present disclosure, and FIG. 6 is a flow chart showing a process of producing a first tape and a second tape for the adhesive tape for a semiconductor package manufacturing process according to an embodiment of the present disclosure. Hereinafter, for convenience of explanation, an example of a method of producing the adhesive tape according to the first embodiment shown in FIG. 1 will be described. Accordingly, the same components as those of the above-described first embodiment will be denoted by the same reference numerals, and detailed description thereof will be omitted.

First, as shown in FIG. 5, a first tape 100 is produced in which the first base film 110, the first adhesive layer 120, and the first release film are sequentially laminated in this order.

The first base film 110 may include a polymer material or a metal material. When the first base film 110 includes a polymer material, the first base film 110 may have a thickness ranging from 10 μm to 150 μm, and one surface thereof in contact with the first adhesive layer 120 may be surface-treated. On the other hand, when the first base film 110 includes a metal material, the first base film 110 may have a thickness ranging from 10 μm to 35 μm. As the polymer material, any one or two or more selected from the group consisting of polyethylene terephthalate (PET), polyimide (PI) and polyolefin (PO) may be used, and as the metal material, a metal film containing 99 wt % or more of aluminum (Al) or copper (Cu) may be used.

The first adhesive layer 120 may be composed of a silicone material, and may have a molecular structure which is a spiral network structure. The first adhesive layer 120 may have a thickness ranging from 80 μm to 120 μm and an adhesive strength ranging from 500 gf/25 mm to 1500 gf/25 mm. The first adhesive layer 120 may include an adhesive base agent composed of a mixture of trimethylated silica, a dimethyl siloxane copolymer and ethylbenzene. In addition, the first adhesive layer 120 may have either a single layer structure composed of any one of the above-described first adhesive composition to sixth adhesive composition, or a multilayer structure composed of two or more of the adhesive compositions.

The first release film 300 may contain fluorine, and may have an adhesive strength ranging from 3 gf/25 mm to 8 gf/25 mm.

Next, a second tape 200 is produced in which the second base film 210, the second adhesive layer 220 and the second release film 300 are sequentially laminated in this order.

The second base film 210 may include a metal material, and may have a thickness ranging from 10 μm to 35 μm. As the metal material, a metal film containing 99 wt % or more of aluminum (Al) or copper (Cu) may be used.

The second adhesive layer 220 may be composed of a silicone material, and may have a molecular structure which is a spiral network structure. The second adhesive layer 220 may have a thickness ranging from 10 μm to 50 μm and an adhesive strength ranging from 200 gf/25 mm to 300 gf/25 mm. The second adhesive layer 220 may include an adhesive base agent composed of trimethylated silica, a dimethyl siloxane copolymer and ethylbenzene mixed together. In addition, the second adhesive layer 220 may have either a single layer structure composed of any one of the above-described first to sixth adhesive compositions, or a multilayer structure composed of two or more of the adhesive compositions.

The second release film 300 may contain fluorine, and may have an adhesive force ranging from 3 gf/25 mm to 8 gf/25 mm.

As described above, the first tape 100 and the second tape 200 may be produced through separate processes. A method of producing the first tape 100 and the second tape 200 will be described later with reference to FIG. 6.

Next, the first release film 300 is removed from the first tape 100 immediately before the semiconductor package 400 manufacturing process, and then the first tape and the second tape are laminated together so that the first adhesive layer 120 and the second base film 210 are in contact with each other, thereby producing the adhesive tape 10.

Thereafter, a subsequent process, for example, a process of forming an EMI shielding layer, may be performed using the adhesive tape 10 produced at the site where the semiconductor package 400 manufacturing process is performed.

As described above, according to the present disclosure, the first tape 100 and the second tape 200 are produced through separate processes, and the first tape 100 and the second tape 200 are laminated together at the site where the semiconductor package 400 manufacturing process is performed, thereby producing the adhesive tape 10. Thus, each of the first tape 100 and the second tape 200 is easy to transport and store, and it is possible to fundamentally prevent the adhesive tape 10 from being damaged in the transport and storage process. In addition, as the process is performed using the high-quality adhesive tape 10, it is possible to improve the yield of the process.

Now, a method of producing the first tape 100 and the second tape 200 will be described in detail with reference to FIG. 6. Hereinafter, for convenience of explanation, an example of the method of producing the second tape 200 will be described. That is, the first tape 100 may be produced in the same manner as the method of producing the second tape 200 as described later.

As shown in FIG. 6, a second base film 210 is first prepared. The second base film 210 may contain 99 wt % or more of aluminum or copper. In this case, the second base film 210 may have a thickness ranging from 10 μm to 35 μm.

Next, an adhesive composition for forming the second adhesive layer 220 is prepared. The adhesive composition may be formed by injecting and mixing predetermined materials in a mixing container at a predetermined ratio. For example, the adhesive composition may be prepared by adding and mixing 0.5 to 1.5 parts by weight of a cross-linker, 0.5 to 1.5 parts by weight of an anchorage additive and 0.5 to 1.8 parts by weight of a catalyst, to and with 100 parts by weight of an adhesive base agent composed of a mixture of trimethylated silica, a dimethyl siloxane copolymer and ethylbenzene.

Next, the prepared adhesive composition is stabilized. The stabilization of the adhesive composition is performed to remove air bubbles in the adhesive composition and at the same time, induce chemical stability and uniform polymerization of the adhesive composition. Specifically, for stabilization of the adhesive composition, the prepared adhesive composition may be maintained in a state of thermal equilibrium for 4 to 12 hours. Although ultrasonic treatment or vacuum suction is generally performed to remove bubbles in an adhesive composition, stabilization of the adhesive composition according to an embodiment of the present disclosure is preferably performed in a state of thermal equilibrium in order to secure chemical stability of the adhesive composition and prevent rapid polymerization thereof, because the adhesive composition contains a silicone component. For reference, the thermal equilibrium state may refer to a stabilized state in which no external stimulus or external force acts.

Next, the stabilized adhesive composition is applied onto the second base film 210 by a comma coater to form the second adhesive layer 220. At this time, the comma coater may apply the adhesive composition onto the second base film 210 so as to have a larger thickness than the target thickness (i.e., final thickness) of the second adhesive layer 220. Specifically, the comma coater may apply the adhesive composition to have a thickness which is 2.5 times to 3.5 times larger than the target thickness of the second adhesive layer 220. For example, when the target thickness of the second adhesive layer 220 is 30 μm, the comma coater may apply the adhesive composition to have a thickness ranging from 75 μm to 105 μm. As will be described later, the thickness of the second adhesive layer 220 may decrease gradually in a subsequent drying heat treatment and curing process and reach the target thickness.

Meanwhile, although this embodiment illustrates the case in which the second adhesive layer 220 is formed using the comma coater, various known process methods may be used because the second adhesive layer 220 has a small thickness. In a modified embodiment, the second adhesive layer 220 may also be formed by a spin coating method or a spray method.

Next, first drying heat treatment on the second adhesive layer 220 is performed. The first drying heat treatment serves to remove the solvent from the adhesive composition while activating the polymerization reaction of the composition, and may be performed using an infrared lamp, and may be performed at a temperature ranging from 60° C. to 80° C. for 3 minutes to 6 minutes.

Next, second drying heat treatment on the second adhesive layer 220 is performed in succession to the first drying heat treatment. The second drying heat treatment serves to activate the polymerization reaction while removing the solvent from the adhesive composition, like the first drying heat treatment, and may be performed using an infrared lamp. The second drying heat treatment may be performed at a higher temperature than the first drying heat treatment, and may be performed for the same time as the first drying heat treatment. For example, the second drying heat treatment may be performed at a temperature ranging from 160° C. to 180° C. for 3 minutes to 6 minutes.

Next, third drying heat treatment on the second adhesive layer 220 is performed in succession to the second drying heat treatment. The third drying heat treatment serves to activate the polymerization reaction while removing the solvent from the adhesive composition, like the first and second drying heat treatments, and may be performed using an infrared lamp. The third drying heat treatment may be performed at a higher temperature than the second drying heat treatment, and may be performed for a longer time than the second drying heat treatment. For example, the third drying heat treatment may be performed at a temperature ranging from 190° C. to 210° C. for 9 minutes to 18 minutes.

Next, the second adhesive layer 220 is cured and stabilized at room temperature for 12 hours to 24 hours. That is, the polymerization reaction in the second adhesive layer 220 is stably finished through a rest period that slowly cools the second base film 210 and the second adhesive layer 220, heated in the first to third drying heat treatment processes, to room temperature, and at the same time, the second adhesive layer 220 may be cured to have a required hardness.

Here, drying the second adhesive layer 220 while increasing the temperature stepwise in the first to third drying heat treatment processes is performed to prevent the second adhesive layer 220 from drying and curing from the surface, whereby air bubbles in the second adhesive layer 220 may be easily removed. In addition, after the third drying heat treatment is performed, the temperature may be decreased slowly to room temperature, thereby obtaining the second adhesive layer 220 having a more stable state and a uniform thickness.

At the time when the above-described first to third drying heat treatments and stabilization at room temperature are completed, the second adhesive layer 220 may have a target thickness.

Next, a second release film 300 containing fluorine is attached onto the second adhesive layer 220. The release film 300 may contain fluorine to facilitate protection and removal of the silicone-containing second adhesive layer 220, and may have an adhesive strength ranging from 3 gf/25 mm to 8 gf/25 mm.

It is possible to produce the second tape 200 through the above-described processes. In addition, as described above, the first tape 100 may be produced in the same manner as the method of producing the second tape 200.

The embodiments described herein and the accompanying drawings are merely illustrative of some of the technical ideas included in the present disclosure. Accordingly, the embodiments disclosed herein are intended to not limit but illustrate the technical idea of the present disclosure, and thus it is obvious that the scope of the technical idea of the present disclosure is not limited by the embodiments. All modifications and specific embodiments that may be easily inferred by those skilled in the art within the scope of the technical idea included in the specification and drawings of the present disclosure should be construed as being included in the scope of the present disclosure.

The invention claimed is:

1. An adhesive tape for a semiconductor package manufacturing process, which is configured to be attached to a semiconductor package bottom surface having a plurality of protruding electrodes formed thereon, the adhesive tape comprising:
   a first adhesive layer formed on a first base film;
   a second base film formed on the first adhesive layer, in which the second base film changes its shape to conform to a topology of the semiconductor package bottom surface when the adhesive tape is attached to the semiconductor package bottom surface, and the second base film contains a metal element so as to independently maintain the changed shape during the process; and
   a second adhesive layer formed on the second base film, the second adhesive layer having a smaller thickness than the first adhesive layer and having a lower adhesive strength than the first adhesive layer,
   wherein each of the first adhesive layer and the second adhesive layer has a spiral network molecular structure and comprises a first adhesive composition containing silicone, and
   wherein the adhesive type further comprises a fluorine-containing release film attached onto the second adhesive layer, wherein the release film has an adhesive strength ranging from 3 gf/25 mm to 8 gf/25 mm.

2. The adhesive tape of claim 1, wherein a surface of the first base film, which is in contact with the first adhesive layer, is a surface treated using a corona discharge treatment method or an ion-assisted reaction method.

3. The adhesive tape of claim 1, wherein the second base film has a thickness ranging from 10 μm to 35 μm, and as the size of each of the protruding electrodes increases, the thickness of the second base film decreases within the thickness range, and as the spacing between the protruding electrodes increases, the thickness of the second base film increases within the thickness range.

4. The adhesive tape of claim 1, wherein the second base film includes a plurality of perforated holes, which are regularly arranged in the second base film and pass through the second base film, in which each of the plurality of perforated holes has any one planar shape selected from the group consisting of a triangular or higher polygonal shape, an oval shape and a circular shape, and the first adhesive layer and the second adhesive layer are in direct contact with each other through the plurality of perforated holes.

5. The adhesive tape of claim 1, wherein the first adhesive layer has a thickness ranging from 100 μm to 700 μm and an adhesive strength of at least 500 gf/25 mm, and the second adhesive layer has a thickness ranging from 10 μm to 50 μm and an adhesive strength ranging from 200 gf/25 mm to 300 gf/25 mm.

6. The adhesive tape of claim 1, wherein the first adhesive layer has a thickness ranging from 100 μm to 700 μm, and as the size of each of the protruding electrodes increases, the thickness of the first adhesive layer decreases within the thickness range, and as the spacing between the protruding electrodes increases, the thickness of the first adhesive layer increases within the thickness range, and the second adhesive layer has a thickness ranging from 10 μm to 50 μm, and as the size of each of the protruding electrodes increases, the thickness of the second adhesive layer increases within the thickness range, and as the spacing between the protruding electrodes increases, the thickness of the second adhesive layer decreases within the thickness range.

7. An adhesive tape for a semiconductor package manufacturing process, which is configured to be attached to a semiconductor package bottom surface having a plurality of protruding electrodes formed thereon, the adhesive tape comprising:
- a first adhesive layer formed on a first base film;
- a second base film formed on the first adhesive layer, in which the second base film changes its shape to conform to a topology of the semiconductor package bottom surface when the adhesive tape is attached to the semiconductor package bottom surface, and the second base film contains a metal element so as to independently maintain the changed shape during the process; and
- a second adhesive layer formed on the second base film, the second adhesive layer having a smaller thickness than the first adhesive layer and having a lower adhesive strength than the first adhesive layer,
- wherein each of the first adhesive layer and the second adhesive layer has a spiral network molecular structure and comprises a first adhesive composition containing silicone, and
- wherein the adhesive tape further comprises:
- a first intermediate layer interposed between the first base film and the first adhesive layer; and
- a second intermediate layer interposed between the second base film and the second adhesive layer,
- wherein each of the first intermediate layer and the second intermediate layer has a spiral network molecular structure, comprises a second adhesive composition containing silicone, and has a basis weight ranging from 0.2 g/m² to 0.5 g/m².

8. The adhesive tape of claim 7, wherein the second adhesive composition comprises a mixture of: toluene; siloxanes and silicones, dimethyl, hydroxy-terminated (CAS No. 70131-67-8); xylene; trimethylated silica; and ethylbenzene.

9. An adhesive tape for a semiconductor package manufacturing process, which is configured to be attached to a semiconductor package bottom surface having a plurality of protruding electrodes formed thereon, the adhesive tape comprising:
- a first adhesive layer formed on a first base film;
- a second base film formed on the first adhesive layer, in which the second base film changes its shape to conform to a topology of the semiconductor package bottom surface when the adhesive tape is attached to the semiconductor package bottom surface, and the second base film contains a metal element so as to independently maintain the changed shape during the process; and
- a second adhesive layer formed on the second base film, the second adhesive layer having a smaller thickness than the first adhesive layer and having a lower adhesive strength than the first adhesive layer,
- wherein each of the first adhesive layer and the second adhesive layer has a spiral network molecular structure and comprises a first adhesive composition containing silicone, and
- wherein the first adhesive composition contains an adhesive base agent comprising a mixture of trimethylated silica, a dimethyl siloxane copolymer, and ethylbenzene.

10. The adhesive tape of claim 9, wherein
the first adhesive composition further contains, based on 100 parts by weight of the adhesive base agent, 0.5 to 1.5 parts by weight of a crosslinker, 0.5 to 1.5 parts by weight of an anchorage additive, and 0.5 to 1.8 parts by weight of a catalyst, and the adhesive base agent comprises a mixture of: xylene; trimethylated silica; ethylbenzene; and siloxanes and silicones which are terminated by, dimethyl or by vinyl group (CAS No. 68083-19-2).

11. The adhesive tape of claim 10, wherein
the crosslinker comprises a mixture of: heptane, siloxanes and silicones which are terminated by methyl or by hydrogen or both (CAS No. 63148-57-2),
the anchorage additive comprises a mixture of: trimethoxy[3-(oxiranylmethoxy)propyl]silane (CAS No. 2530-83-8; siloxanes and silicones, dimethyl, Me vinyl, hydroxy-terminated reaction products with trimethoxy[3-oxiranylmethoxy)propyl]silane (CAS No. 102782-94-5); methanol; and divinyl hexamethyl cyclotetrasiloxane (CAS No. 17980-61-9), and
the catalyst comprises a mixture of: platinum 1,3-diethenyl-1,1,3,3-tetramethyldisiloxane complexes (CAS No. 68478-92-2); siloxanes and silicones which are terminated by dimethyl or by vinyl group (CAS No. 68083-19-2); tetramethyldivinyldisiloxane (CAS No. 2627-95-4); and siloxanes and silicones which are terminated by dimethyl or by hydroxy or by both (CAS No. 70131-67-8).

12. The adhesive tape of claim 9, wherein the first adhesive composition further contains, based on 100 parts by weight of the adhesive base agent composed of a first base agent and a second base agent, mixed with each other at a ratio of 95:5 to 99:1, 0.5 to 1.5 parts by weight of a crosslinker, 0.5 to 1.5 parts by weight of an anchorage additive, and 0.5 to 1.5 parts by weight of a catalyst,
wherein the first base agent includes a mixture of: xylene; trimethylated silica; ethylbenzene; and siloxanes and silicones which are terminated by, dimethyl or by vinyl group (CAS No. 68083-19-2), and the second base agent includes a mixture of: siloxanes and silicones which are terminated by dimethyl or by vinyl group (CAS No. 68083-19-2); and 1-ethynylcyclohexanol (CAS No. 78-27-3).

13. The adhesive tape of claim 9, wherein
the first adhesive composition further contains, based on 100 parts by weight of the adhesive base agent composed of a third base agent and a fourth base agent, mixed with each other at a ratio of 50:50 to 80:20, 0.5 to 3 parts by weight of a polymerization initiator,
wherein the third base agent comprises a mixture of: xylene; ethylbenzene; toluene; and siloxanes and silicones, dimethyl, hydroxy-terminated reaction products with chlorotrimethylsilane, hydrochloric acid, isopropyl alcohol, and sodium silicate (CAS No. 68440-70-0),
the fourth base agent comprises a mixture of: toluene; siloxanes and silicones, dimethyl, hydroxy-terminated (CAS No. 70131-67-8); xylene; trimethylated silica; and ethylbenzene, and
the polymerization initiator comprises benzoyl peroxide.

14. The adhesive tape of claim 9, wherein
the first adhesive composition further contains, based on 100 parts by weight of the adhesive base agent composed of a third base agent and a fifth base agent, mixed with each other at a ratio of 50:50 to 80:20, 0.5 to 3 parts by weight of a polymerization initiator,
wherein the third base agent comprises a mixture of: xylene; ethylbenzene; toluene; and reaction products of siloxanes and silicones which are terminated by dimethyl or by hydroxy with chlorotrimethylsilane, hydrochloric acid, isopropyl alcohol, and sodium silicate (CAS No. 68440-70-0), the fifth base agent comprises a mixture of: toluene; siloxanes and silicones, di-Me, Me vinyl, vinyl group-terminated (CAS No. 68083-18-1); xylene; trimethylated silica; ethylbenzene; siloxanes and silicones which are terminated by dimethyl or by methyl or by hydroxy (CAS No. 67923-19-7); and 1-ethynylcyclohexanol (CAS No. 78-27-3), and the polymerization initiator comprises benzoyl peroxide.

15. A method for producing the adhesive tape of claim 1, the method comprising steps of:

producing a first tape in which a first base film comprising a polymer material or a metal material, a first adhesive layer having a spiral network molecular structure and containing silicone, and a first release film containing fluorine, are sequentially laminated in this order;

producing a second tape in which a second base film comprising a metal material, a second adhesive layer having a spiral network molecular structure and containing silicone, and a second release film containing fluorine, are sequentially laminated in this order;

removing the first release film from the first tape; and laminating the first tape and the second tape together so that the first adhesive layer and the second base film are in contact with each other.

* * * * *